United States Patent
Endo

(10) Patent No.: US 9,735,325 B2
(45) Date of Patent: Aug. 15, 2017

(54) SEMICONDUCTOR DEVICE AND MANUFACTURING METHOD OF SEMICONDUCTOR DEVICE

(71) Applicant: Kabushiki Kaisha Toshiba, Minato-ku (JP)

(72) Inventor: Mitsuyoshi Endo, Yamato (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 102 days.

(21) Appl. No.: 14/638,430

(22) Filed: Mar. 4, 2015

(65) Prior Publication Data
US 2016/0079491 A1 Mar. 17, 2016

(30) Foreign Application Priority Data
Sep. 16, 2014 (JP) ................................. 2014-188004

(51) Int. Cl.
*H01L 33/00* (2010.01)
*H01L 33/54* (2010.01)
(Continued)

(52) U.S. Cl.
CPC .......... *H01L 33/54* (2013.01); *H01L 21/6836* (2013.01); *H01L 24/96* (2013.01);
(Continued)

(58) Field of Classification Search
CPC ..... H01L 33/00; H01L 33/0095; H01L 33/54; H01L 33/48; H01L 33/486; H01L 33/20;
(Continued)

(56) References Cited

U.S. PATENT DOCUMENTS 6,696,704 B1 * 2/2004 Maeda .................. H01L 25/167
257/100
7,943,426 B2 5/2011 Hwan
(Continued)

FOREIGN PATENT DOCUMENTS

DE 10 2008 010 512 A1 8/2009
EP 1 850 401 A1 10/2007
(Continued)

OTHER PUBLICATIONS

Combined Office Action and Search Report issued on May 12, 2016 in Taiwanese Patent Application No. 104105066 with partial English translation and English translation of category of cited documents.
Extended European Search Report issued Sep. 30, 2015 in Patent Application No. 15157757.4.

*Primary Examiner* — Monica D Harrison
(74) *Attorney, Agent, or Firm* — Oblon, McClelland, Maier & Neustadt, L.L.P.

(57) ABSTRACT

According to one embodiment, a manufacturing method of a semiconductor device includes the transferring a first group from a first support to a second support; the deforming the second support to convert each pitch of the semiconductor chips in the first group transferred on the second support into a second pitch different from the first pitch; the forming an insulating layer around each of the semiconductor chips, the insulating layer covering each of the semiconductor chips in the first group arranged in the second pitch; and the dicing the insulating layer. The first group is selected from a plurality of semiconductor chips supported by the first support. The plurality of semiconductor chips is arranged in an initial pitch. The first group is arranged in a first pitch being longer than the initial pitch.

14 Claims, 18 Drawing Sheets

(51) Int. Cl.
*H01L 21/683* (2006.01)
*H01L 23/00* (2006.01)
*H01L 33/20* (2010.01)
*H01L 33/62* (2010.01)
*H01L 21/56* (2006.01)

(52) U.S. Cl.
CPC ........ *H01L 33/0095* (2013.01); *H01L 21/561* (2013.01); *H01L 33/20* (2013.01); *H01L 33/62* (2013.01); *H01L 2221/68322* (2013.01); *H01L 2221/68327* (2013.01); *H01L 2221/68336* (2013.01); *H01L 2221/68368* (2013.01); *H01L 2224/04105* (2013.01); *H01L 2224/18* (2013.01); *H01L 2924/18162* (2013.01); *H01L 2933/005* (2013.01); *H01L 2933/0033* (2013.01)

(58) Field of Classification Search
CPC ................. H01L 33/62; H01L 2933/00; H01L 2933/005; H01L 2933/0033; H01L 2224/18; H01L 21/56; H01L 21/561; H01L 21/68; H01L 21/6836
USPC ............................................ 438/26; 257/100
See application file for complete search history.

(56) References Cited

U.S. PATENT DOCUMENTS

| | | |
|---|---|---|
| 8,592,257 B2 | 11/2013 | Nakasato et al. |
| 2004/0195578 A1 | 10/2004 | Kim |
| 2006/0017061 A1 | 1/2006 | Sakamoto et al. |
| 2008/0122119 A1 | 5/2008 | Kian et al. |
| 2009/0206357 A1 | 8/2009 | Ito et al. |
| 2013/0320378 A1 | 12/2013 | Kumo et al. |
| 2014/0077235 A1 | 3/2014 | Kwon et al. |
| 2014/0197430 A1 | 7/2014 | Kwon et al. |

FOREIGN PATENT DOCUMENTS

| | | |
|---|---|---|
| JP | 2001 308234 | 11/2001 |
| JP | 2002-118124 A | 4/2002 |
| JP | 2005-5604 A | 1/2005 |
| JP | 2007-242662 A | 9/2007 |
| JP | 2009-239116 A | 10/2009 |
| JP | 2010-87064 A | 4/2010 |
| JP | 2013-247340 A | 12/2013 |
| WO | WO 2013/151387 A1 | 10/2013 |

* cited by examiner

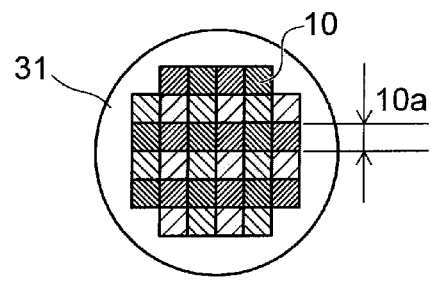
FIG. 4A
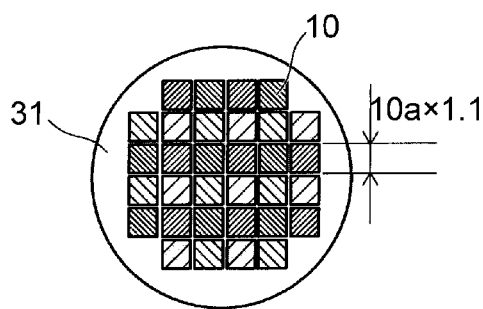
FIG. 4B
FIG. 4C
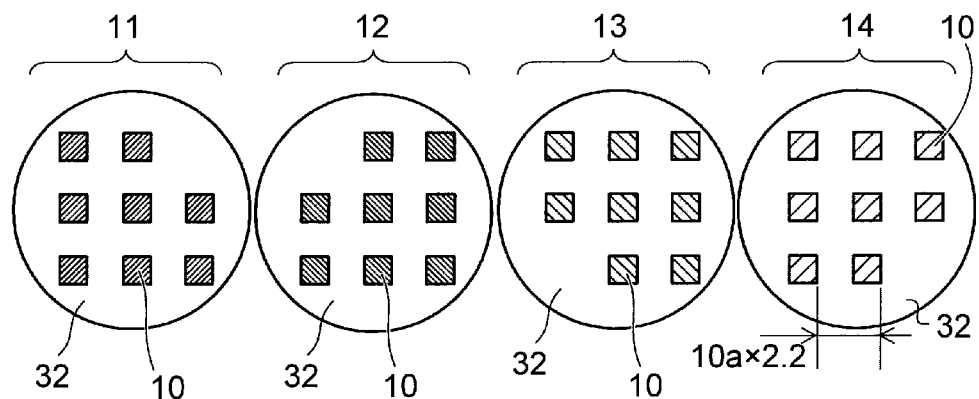

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from Japanese Patent Application No. 2014-188004, filed on Sep. 16, 2014; the entire contents of which are incorporated herein by reference.

FIELD

Embodiments described herein relate generally to a semiconductor device and a manufacturing method of semiconductor device.

BACKGROUND

There is a wafer level packaging method as an example of a method of packaging a semiconductor chip. For example, a new apparatus may be necessarily developed or introduced in order to perform the wafer level packaging method with the expanded pitch in a case where packaging is performed by expanding pitches of a plurality of semiconductor chips through a tape expanding method. The pitch cannot be expanded to be only an integer multiple of the pitch in pitch conversion performed by thinning and transferring of the selected chip. Accordingly, a rearrangement method of semiconductor chips with a low cost and a high degree of freedom in an arrangement pitch has been demanded.

BRIEF DESCRIPTION OF THE DRAWINGS

FIG. 4A to FIG. 4C are schematic plan views showing still another method for manufacturing the semiconductor device of the embodiment;

DETAILED DESCRIPTION

Figure 1A:
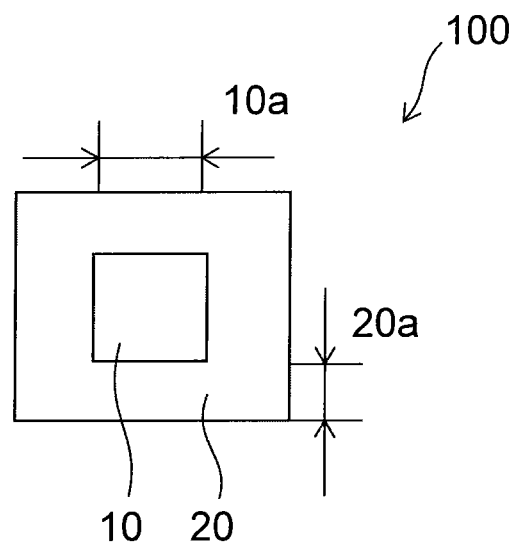
FIG. 1A and FIG. 1B are schematic plan views of a semiconductor device of an embodiment.

According to one embodiment, a manufacturing method of a semiconductor device includes the transferring a first group from a first support to a second support; the deforming the second support to convert each pitch of the semiconductor chips in the first group transferred on the second support into a second pitch different from the first pitch; the forming an insulating layer around each of the semiconductor chips, the insulating layer covering each of the semiconductor chips in the first group arranged in the second pitch; and the dicing the insulating layer. The first group is selected from a plurality of semiconductor chips supported by the first support. The plurality of semiconductor chips is arranged in an initial pitch. The first group is arranged in a first pitch being longer than the initial pitch.

Hereinafter, embodiments will be described with reference to the drawings. The same components are denoted by the same reference numerals in the drawings.

For example, pitch conversion of a chip is necessary when a fan-out chip size package (CSP) is formed in a wafer level process. However, if the pitch conversion is formed by using a tape expanding method, positioning accuracy is degraded and an expansion rate is reduced. Thus, application of the tape expanding method may be difficult. If the pitch conversion is performed by a thinning method, pitch conversion to an integer multiple of a pitch is performed and a package size is an integer multiple of a chip size. Thus, the degree of freedom in a ratio of a dimension of a semiconductor chip to a package dimension may be insufficient.

Considering these, a semiconductor device and a manufacturing method of the semiconductor device according to an embodiment can have a high degree of freedom in a ratio of a dimension of a semiconductor chip to a package dimension. The semiconductor device and the manufacturing method of the semiconductor device according to the embodiment will be described below.

Figure 1B:
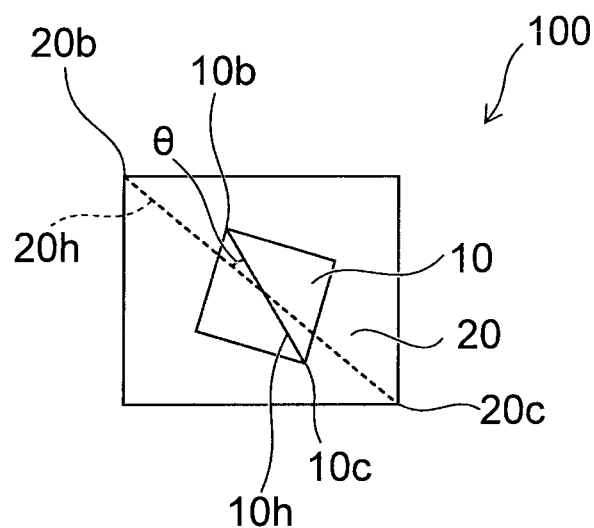

FIG. 1A and FIG. 1B are schematic plan views of the semiconductor device according to an embodiment.

As shown in FIG. 1A, a semiconductor device 100 according to the embodiment includes a semiconductor chip 10 and an insulating layer 20. The insulating layer 20 is provided around the semiconductor chip 10 and covers at least surrounding of the semiconductor chip 10.

As viewed in the upper surface of the semiconductor chip 10, a ratio R of an area of the semiconductor chip 10 to an area of a portion at which only the insulating layer 20 is provided is other than an integer multiple. For example, the ratio R is 2.2 times or more and 3.8 times or less excluding three times.

In the description which will be made later, pitches of a plurality of the semiconductor chips 10 before dicing may be set to be other than an integer multiple of a width 10a of the semiconductor chip 10. With this, it is possible to freely set the ratio R of the area and thereby it is possible to improve the degree of freedom when a structure of the semiconductor device 100 is designed. The width 10a of the semiconductor chip 10 is the value of the width of each of the plurality of semiconductor elements provided on a substrate in a state of a wafer minus the width of a dicing (chip dicing). The width 20a of the insulating layer 20 is the value of the width of the width of the insulating layer 20 covering each of the plurality of semiconductor chips 10 minus the width of a dicing (package dicing).

The semiconductor chip 10 is square shape in a plane view and has four corner portions. The insulating layer 20 surrounding the semiconductor chip 10 also has four corner portions. According to the semiconductor device 100 shown in FIG. 1B, a diagonal line of the semiconductor chip 10 and a diagonal line of the insulating layer 20 are shifted from each other in order not to match each other. The corner portion of the semiconductor chip 10 does not face the corner portion of the insulating layer 20 but faces a side portion of the insulating layer 20. The corner portion of the semiconductor chip 10 has a sharp shape or may have, for example, a round shape.

For example, a first corner portion 10b and a second corner portion 10c among the four corner portions of the semiconductor chip 10 are joined to form a diagonal line 10h. The second corner portion 10c is positioned to be an opposite angle to the first corner portion 10b. The diagonal line 10h crosses, for example, a diagonal line 20h. The diagonal line 20h is formed by joining a third corner portion 20b and a fourth corner portion 20c among the four corner portions of the insulating layer 20. The third corner portion 20b is nearest to the first corner portion 10b of the semiconductor chip 10. The fourth corner portion 20c is nearest to the second corner portion 10c of the semiconductor chip 10. The diagonal line 10h and the diagonal line 20h are crossed to form an acute angle. An angle θ of the acute angle is not smaller than 0° and not larger than 15°. Two sides of the semiconductor chip 10 forming the corner portion extend and cross to make a point. The point is set as a reference point in the diagonal line when the corner portions have a round shape. Additionally, a side of the semiconductor chip 10 is not parallel with a side of a package which corresponds to the side of the semiconductor chip 10 but inclined to form an acute angle (not larger than 15°). When the semiconductor chip 10 has four sides, the four sides cause an acute angle (not larger than 15°) to be formed, respectively.

Even though stress is applied from the outside of the individualized semiconductor device 100 to the corner portion of the insulating layer 20 which is packaged, a position of the corner portion of the semiconductor chip 10 is shifted from a position of the corner portion of the insulating layer 20 in the individualized semiconductor device 100, and thus it is possible to disperse the stress applied to the corner portion of the semiconductor chip 10 and it is possible to improve reliability in the semiconductor device 100.

A manufacturing method of the semiconductor device according to the embodiment will be described with reference to FIG. 2A to FIG. 2D.

Figure 2A:
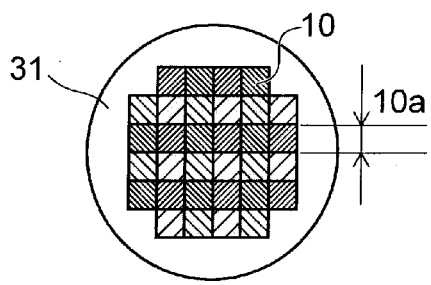
FIG. 2A to FIG. 2D are schematic plan views showing a method for manufacturing the semiconductor device of the embodiment.

As shown in FIG. 2A, a plurality of the semiconductor chips 10 are supported on a transfer source tape 31 (first support). A pitch between the semiconductor chips 10 is equal to the width 10a of the semiconductor chip 10. For example, a tape of which the adhesive strength becomes low by irradiation of UV is used as the transfer source tape 31.

As a forming method of the plurality of semiconductor chips 10, for example, a plurality of semiconductor elements are formed on a substrate in a state of a wafer. Then, the wafer is subjected to dicing (chip dicing) after the substrate is separated or in remaining of the substrate and the plurality of semiconductor elements are individualized. Thus the plurality of semiconductor chips 10 are formed. A pitch (initial pitch) of the plurality of semiconductor chips 10 individualized includes a width 10a of the semiconductor chip 10 and a space formed by dicing.

A transfer destination tape 32 (second support, third support) is attached to a surface of the semiconductor chips 10 which is an opposite side to a surface on which the semiconductor chips 10 are attached to the transfer source tape 31. Then, the transfer source tape 31 attached to the semiconductor chips 10 is separated. At this time, the semiconductor chips 10 selected from the transfer source tape 31 are transferred to the transfer destination tape 32. The semiconductor chips 10 which are not selected from the transfer source tape 31 remain on the transfer source tape 31.

Figure 2B:
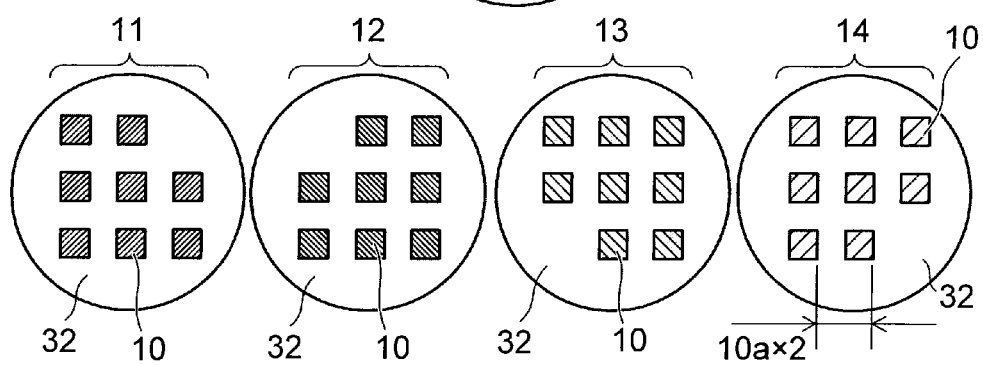

As shown in FIG. 2B, groups (first group 11 to fourth group 14) to which the semiconductor chips 10 selected from the transfer source tape 31 belong are rearranged on the transfer destination tape 32. In the embodiment, the semiconductor chips 10 are equally formed on, for example, four transfer destination tapes 32. That is, the semiconductor chips 10 formed on the transfer source tape 31 are thinned to be divided by four (thinning method). With this, a pitch (first pitch) of the rearranged groups 11 to 14 is two times the width 10a of the semiconductor chip. The number of the groups and a selection method at the time of rearrangement are not limited to the embodiment. For example, the pitch (first pitch) of the first group 11 may be different from the pitch (third pitch) of the second group 12, and the first pitch and the third pitch is longer than the initial pitch.

Then, the transfer destination tape 32 is stretched by using a tape expanding method. Accordingly, the transfer destination tape 32 holds a stretched state even after relief of the stress.

Figure 2C:
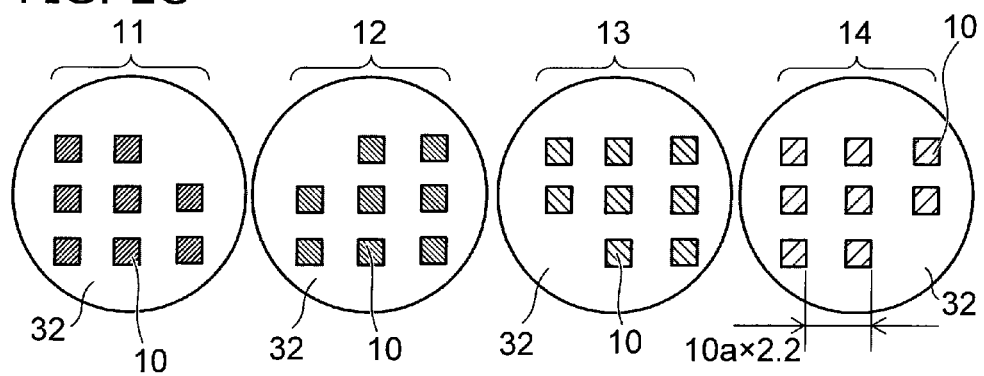

As shown in FIG. 2C, a second pitch between the semiconductor chips 10 in the rearranged groups 11 to 14 is longer than the first pitch before stretching. The second pitch between the semiconductor chips 10 is, for example, 2.2 times the width 10a of the semiconductor chip 10. The second pitch between the semiconductor chips 10 is larger than an integer multiple of the width 10a of the semiconductor chip and the second pitch is not more than 1.2 times the integer multiple of the width 10a.

Figure 2D:
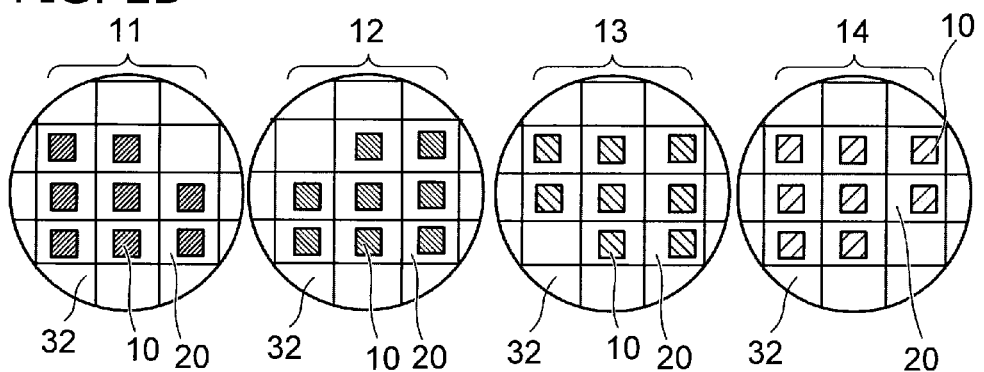

The insulating layer 20 is formed around the respective semiconductor chips 10 in the groups 11 to 14. The insulating layer 20 covers the semiconductor chip 10. Then, as shown in FIG. 2D, each semiconductor chip 10 with the insulating layer 20 is subjected to dicing (package dicing) and thus the semiconductor device according to the embodiment is formed. The insulating layer 20 at an area between the semiconductor chips 10 is cut.

If a dicing line parallel with the side of the semiconductor chip 10 is formed, the side of the semiconductor chip 10 and the side of the insulating layer 20 become parallel, as shown in FIG. 1A. If an inclined dicing line to the side of the semiconductor chip 10 is formed, it is possible for the position of the corner portion of the semiconductor chip 10 to be shifted from the position of the corner portion of the insulating layer 20, as shown in FIG. 1B.

According to the embodiment, it is possible to set the pitch (second pitch) between the rearranged semiconductor chips 10 to be other than the integer multiple of the width 10a of the semiconductor chip 10 in a rearrangement process of the semiconductor chip 10. For example, the pitch between the rearranged semiconductor chips 10 is limited to the integer multiple of the width 10a at the time of using only the thinning method in the rearrangement process of the semiconductor chip 10. On the other hand, according to the embodiment, it is possible for the pitch (second pitch) between the rearranged semiconductor chips 10 to be set to a value finer than the pitch (integer multiple of the width 10a) obtained when the thinning method is used. For example, the pitch (second pitch) of the first group 11 may be different from the pitch (forth pitch) of the second group 12.

Accordingly, it is possible to improve the degree of freedom in the pitch obtained when the semiconductor chips 10 are rearranged. That is, it is possible to improve the degree of freedom in a ratio of a dimension of the semiconductor chip 10 to a dimension of a package. For example, when a semiconductor device with a dimension of a package having a standardized constant size is manufactured, it is possible to freely select a chip size and to form the semiconductor chip. It is possible to freely form a semiconductor device according to usage or performance, for example, a semiconductor device in which a ratio of the dimension of the semiconductor chip 10 to the dimension of the package is sufficiently large and thus it is possible to sufficiently protect the semiconductor chip 10, and a semiconductor device having a chip size large enough for high power.

In addition, according to the embodiment, the semiconductor chips 10 are rearranged and then the tape expanding method is used. Combination of the thinning and transferring method and the tape expanding method can cause the extent of stretching the tape to be suppressed, compared to when only the tape expanding method is used, and it is possible to suppress variation in position of the semiconductor chip 10 due to the stress applied to the tape. That is, accuracy in setting of the pitch is improved.

According to the embodiment, it is possible to suppress the extent of stretching the tape, and thus an area of a region at which the semiconductor chips 10 of each group are rearranged is not caused to largely increase. Accordingly, it is possible to proceed to formation of the insulating layer 20 by using a wafer level package process similar to before rearrangement even after rearrangement.

Another manufacturing method of the semiconductor device according to the embodiment will be described with reference to FIG. 3A to FIG. 3C.

Figure 3A:
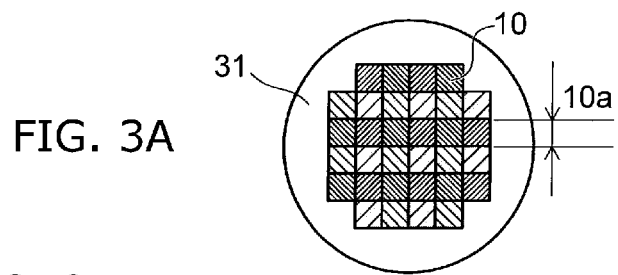
FIG. 3A to FIG. 3C are schematic plan views showing another method for manufacturing the semiconductor device of the embodiment.

As shown in FIG. 3A, the plurality of the semiconductor chips 10 are separated and supported on the transfer source tape 31. The pitch between the semiconductor chips 10 is equal to the width 10a of the semiconductor chip 10. The initial pitch of the plurality of semiconductor chips 10 individualized includes a width 10a of the semiconductor chip 10 and a space formed by dicing.

The transfer destination tape 32 (second support) is attached to a surface of the semiconductor chips 10 which is an opposite side to a surface on which the semiconductor chips 10 are attached to the transfer source tape 31. Then, the transfer source tape 31 attached to the semiconductor chips 10 is separated. At this time, the semiconductor chips 10 selected from the transfer source tape 31 are transferred to the transfer destination tape 32. The semiconductor chips 10 which are not selected from the transfer source tape 31 remain on the transfer source tape 31.

Figure 3B:
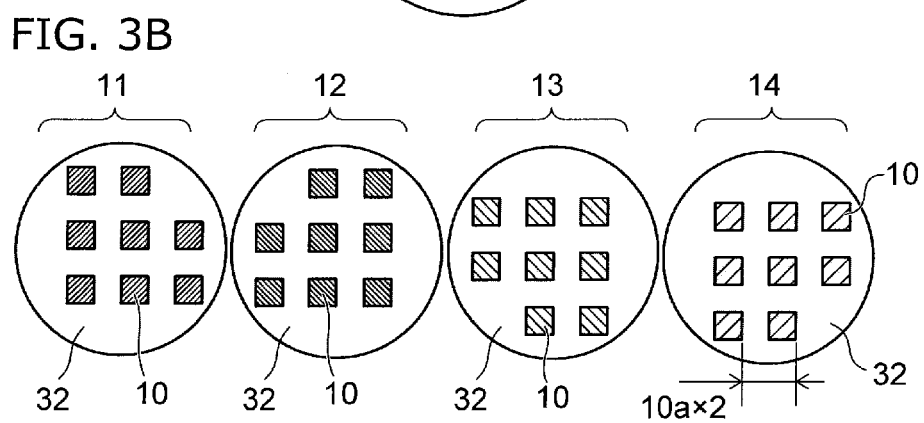

As shown in FIG. 3B, the respective groups 11 to 14 to which the semiconductor chips 10 selected from the transfer source tape 31 belong are rearranged on the transfer destination tape 32. The pitch in the rearranged groups 11 to 14 is two times the width 10a of the semiconductor chip. Then, the transfer destination tape 32 is heated to be reduced. For example, the pitch (first pitch) of the first group 11 may be different from the pitch (third pitch) of the second group 12.

Figure 3C:
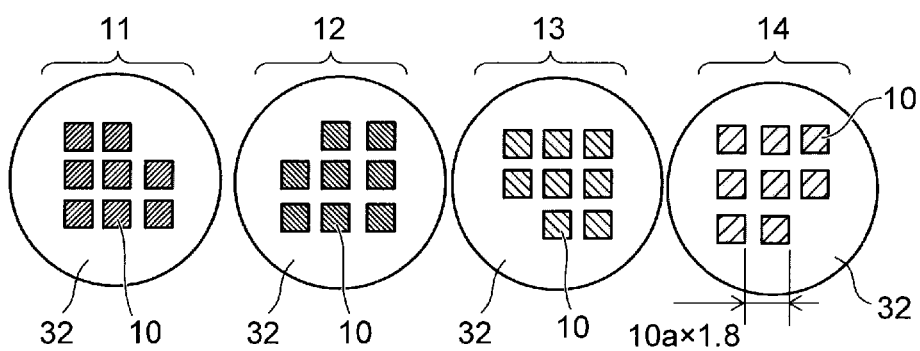

As shown in FIG. 3C, the second pitch between the semiconductor chips 10 in the rearranged groups 11 to 14 is shorter than the first pitch before reduction. The second pitch between the semiconductor chips 10 is, for example, 1.8 times the width 10a of the semiconductor chip 10. The second pitch between the semiconductor chips 10 is smaller than an integer multiple of the width 10a of the semiconductor chip and the second pitch is not less than 0.8 times the integer multiple of the width 10a. For example, the pitch (second pitch) of the first group 11 may be different from the pitch (forth pitch) of the second group 12.

The insulating layer 20 is formed around the respective semiconductor chips 10 in the groups 11 to 14. The insulating layer 20 covers the semiconductor chip 10. Then, similarly to the description based on FIG. 2D, each semiconductor chip 10 with the insulating layer 20 is subjected to dicing and thus the semiconductor device according to the embodiment is formed. The insulating layer 20 at a region between the semiconductor chips 10 is cut.

If a dicing line parallel with the side of the semiconductor chip 10 is formed, the side of the semiconductor chip 10 and the side of the insulating layer 20 become parallel, as shown in FIG. 1A. If an inclined dicing line to the side of the semiconductor chip 10 is formed, it is possible for the position of the corner portion of the semiconductor chip 10 to be shifted from the position of the corner portion of the insulating layer 20, as shown in FIG. 1B.

According to the embodiment, similarly to the above-described manufacturing method, it is possible to set the pitch (second pitch) between the rearranged semiconductor chips 10 to be other than the integer multiple of the width 10a of the semiconductor chip 10. According to the embodiment, it is possible for the pitch (second pitch) between the rearranged semiconductor chips 10 to be set to a value finer than the pitch (integer multiple of the width 10a) obtained when the thinning method is used.

Accordingly, it is possible to improve the degree of freedom in the pitch obtained when the semiconductor chips 10 are rearranged. That is, it is possible to improve the degree of freedom in a ratio of a dimension of the semiconductor chip 10 to a dimension of a package.

According to the embodiment, it is possible to suppress the extent of reducing the tape, and thus an area of a region at which the semiconductor chips 10 of each group are rearranged is not caused to largely increase. Accordingly, it is possible to proceed to formation of the insulating layer 20 and the like by using a wafer level package process similar to before rearrangement even after rearrangement.

Still another manufacturing method of the semiconductor device according to the embodiment will be described with reference to FIG. 4A to FIG. 4C.

Similarly to the above-described manufacturing method, the plurality of the semiconductor chips 10 are separated and supported on the transfer source tape 31, as shown in FIG. 4A. The pitch between the semiconductor chips 10 is equal to the width 10a of the semiconductor chip 10. The initial pitch of the plurality of semiconductor chips 10 individualized includes the width 10a of the semiconductor chip 10 and a space formed by dicing.

As shown in FIG. 4B, the transfer source tape 31 is stretched by using the tape expanding method. The first pitch between the semiconductor chips 10 is, for example, 1.1 times the width 10a of the semiconductor chip 10. Thus, the first pitch is longer than the initial pitch.

The transfer destination tape 32 is attached to a surface of the semiconductor chips 10 which is an opposite side to a surface of which the semiconductor chips 10 are attached to the transfer source tape 31. Then, the transfer source tape 31 attached to the semiconductor chips 10 is separated.

As shown in FIG. 4C, the groups 11 to 14 to which the semiconductor chips 10 selected from the transfer source tape 31 belong are rearranged on the transfer destination tape 32. The second pitch between the semiconductor chips 10 in the rearranged groups 11 to 14 is, for example, 2.2 times the width 10a of the semiconductor chip 10. The second pitch between the semiconductor chips 10 is larger than an integer multiple of the width 10a of the semiconductor chip and the second pitch is not more than 1.2 times the integer multiple of the width 10a. For example, the pitch (second pitch) of the first group 11 may be different from the pitch (third pitch) of the second group 12.

The insulating layer 20 is formed around the respective semiconductor chips 10 in the groups 11 to 14. The insulating layer 20 covers the semiconductor chip 10. Then, similarly to the description based on FIG. 2D, each semiconductor chip 10 with the insulating layer 20 is subjected to dicing and thus the semiconductor device according to the embodiment is formed. The insulating layer 20 at a region between the semiconductor chips 10 is cut.

If a dicing line parallel with the side of the semiconductor chip 10 is formed, the side of the semiconductor chip 10 and the side of the insulating layer 20 become parallel, as shown in FIG. 1A. If an inclined dicing line to the side of the semiconductor chip 10 is formed, it is possible for the position of the corner portion of the semiconductor chip 10 to be shifted from the position of the corner portion of the insulating layer 20, as shown in FIG. 1B.

According to the embodiment, similarly to the above-described manufacturing method, it is possible to set the pitch (second pitch) between the rearranged semiconductor chips 10 to be other than an integer multiple of the width 10a of the semiconductor chip 10. According to the embodiment, it is possible to set the pitch (second pitch) between the rearranged semiconductor chips 10 to be a finer value than the pitch (integer multiple of the width 10a) obtained when the thinning method is used.

Accordingly, it is possible to improve the degree of freedom in the pitch obtained when the semiconductor chips 10 are rearranged. That is, it is possible to improve the degree of freedom in a ratio of a dimension of the semiconductor chip 10 to a dimension of a package.

According to the embodiment, it is possible to suppress the extent of stretching the tape, and thus an area of a region at which the semiconductor chips 10 of each group are rearranged is not caused to largely increase. Accordingly, it is possible to proceed to formation of the insulating layer 20 and the like by using a wafer level package process similar to before rearrangement even after rearrangement.

Furthermore, according to the embodiment, the semiconductor chips 10 are rearranged after using the tape expanding method. Combination of the tape expanding method and the thinning and transferring method can cause the extent of stretching the tape to be suppressed, compared to when only the tape expanding method is used, and it is possible to suppress variation in position of the semiconductor chip 10 due to the stress applied to the tape. That is, accuracy in setting of the pitch is improved.

According to the above-described embodiments, it is possible to use a wafer level package process as a method of forming a fan-out CSP which has a dimension of a package larger than a dimension of the semiconductor chip 10, for example. Accordingly, it is possible to reduce a dimension of a package and to largely reduce cost in packaging.

Figure 5:
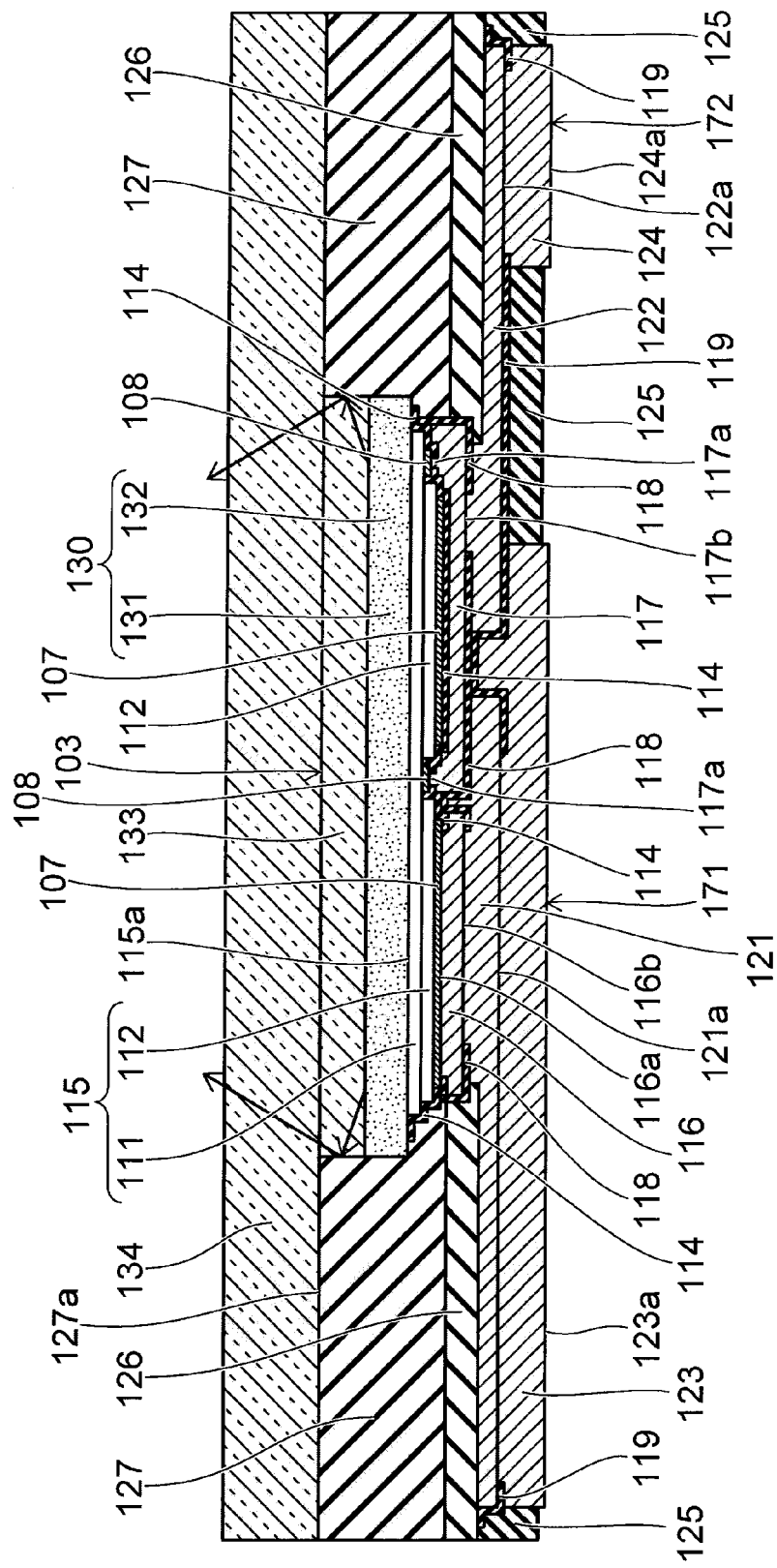
FIG. 5 is a schematic cross-sectional view of a semiconductor device of another embodiment.

FIG. 5 is a schematic cross-sectional view of a semiconductor device according to another embodiment.

Figure 6:
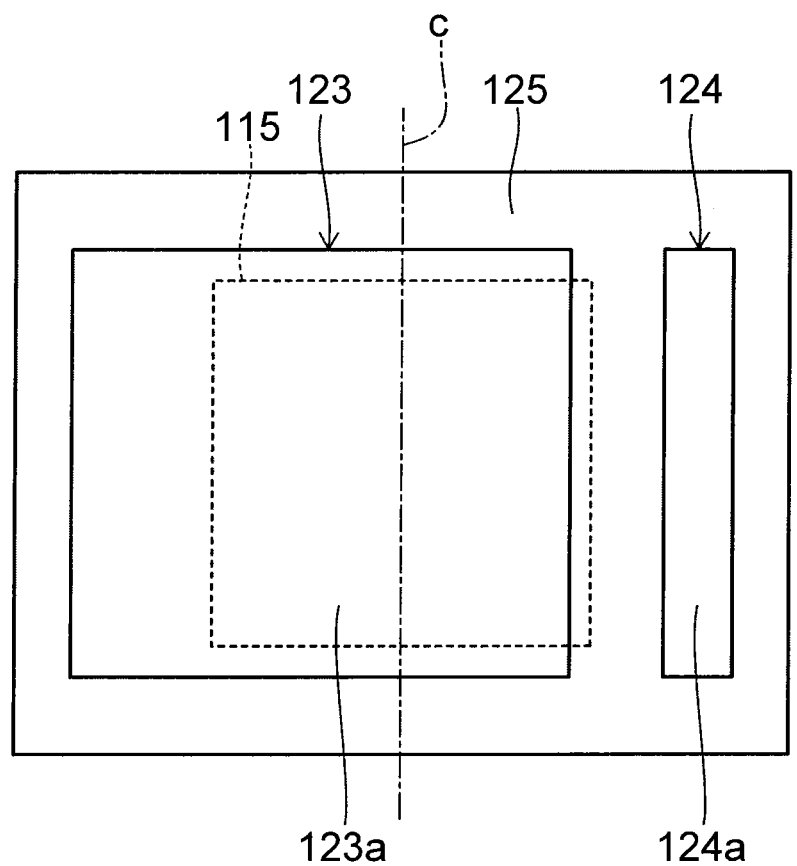
FIG. 6 is a schematic plan view of a semiconductor device of the another embodiment.

FIG. 6 is a schematic plane view on a mount surface of the semiconductor device according to the other embodiment and FIG. 6 corresponds to a bottom view with respect to FIG. 5.

The semiconductor device according to the other embodiment includes a chip-sized device formed at a wafer level (simply refer to a chip below) 103, an insulating member 127 provided around the chip 103, and metal layers 171 and 172 provided on the mount surface.

The chip 103 has electrodes 107 and 108, first interconnection layers (on-chip interconnection layer) 116 and 117, optic layers 130 and 133, and a semiconductor layer 115 which is provided between the first interconnection layers 116 and 117 and the optic layers 130 and 133.

Figure 7:
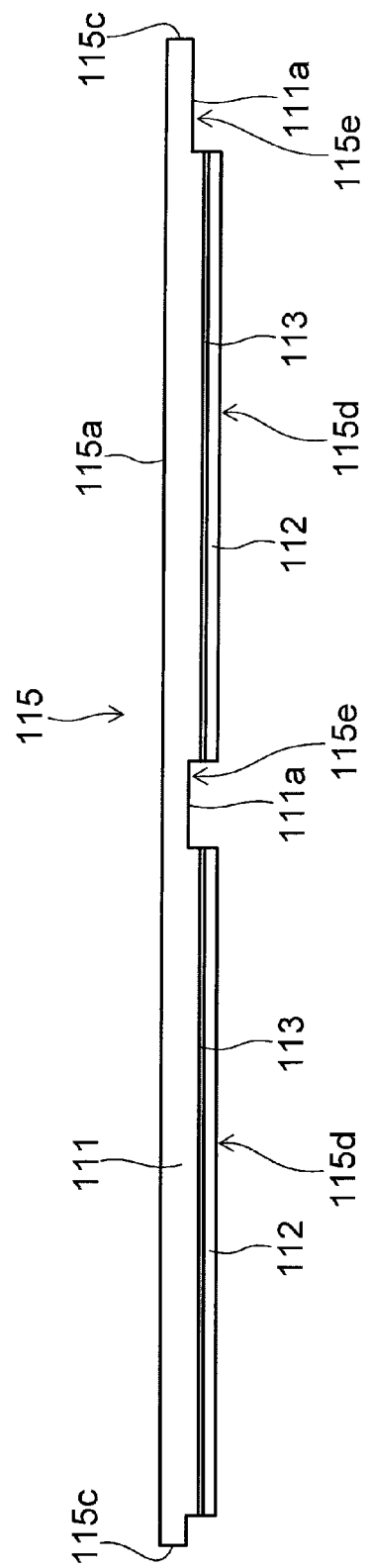
FIG. 7 is a schematic cross-sectional view of the semiconductor layer of the another embodiment.

FIG. 7 is an enlarged schematic cross-sectional view of the semiconductor layer 115.

The semiconductor layer 115 contains gallium nitride, for example. The semiconductor layer 115 has a first layer 111 including an n-type semiconductor, a second layer 112 including a p-type semiconductor, and a luminous layer 113 which is provided between the first layer 111 and the second layer 112.

The first layer 111 includes a foundation buffer layer and an n-type GaN layer, for example. The second layer 112 includes a p-type GaN layer, for example. The luminous layer 113 contains materials which respectively emit blue light, purple light, bluish purple light, ultraviolet light, and the like. The luminous layer 13 has a luminous peak wavelength of 430 nm to 470 nm, for example.

Figure 8A:
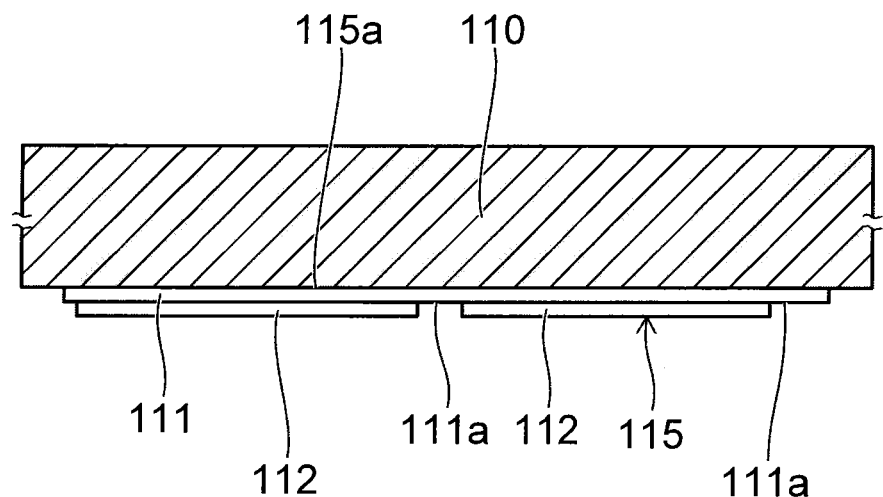
FIG. 8A to FIG. 17B are schematic views showing a method for manufacturing the semiconductor device of the another embodiment.

As shown in FIG. 8A, the semiconductor layer 115 is obtained by epitaxial growing on a substrate 110. For example, a silicon substrate, a sapphire substrate, a silicon carbide substrate, or the like may be used as the substrate 110. The first layer 111, the luminous layer 113, and the second layer 112 are obtained by epitaxial growing on the substrate 110 in order. Then, the second layer 112 and the luminous layer 113 are selectively removed by using a reactive ion etching (RIE) method using a mask (not shown).

Accordingly, the semiconductor layer 115 has a region (luminous region) 115d and a region 115e. The region 115d has a stacked layer of the second layer 112 and the luminous layer 113. The region 115e has a second surface 111a of the first layer 111 which is not covered by the luminous layer 113 and the second layer 112.

Figure 8B:
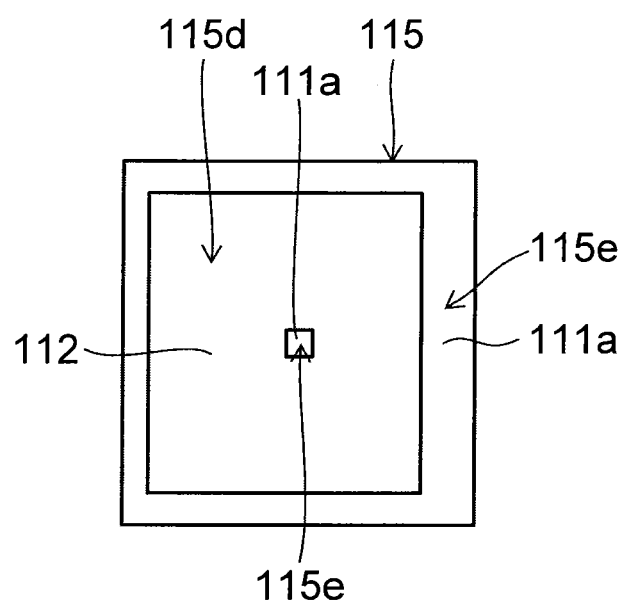

FIG. 8B corresponds to a bottom view of the semiconductor layer 115 shown in FIG. 7 and FIG. 8A.

As shown in FIG. 8B, the region 115e has an island shape surrounded by the luminous region 115d, for example and the region 115e is formed on an outer circumference of the luminous region 115d to continue and surround the luminous region 115d. The luminous region 115d has an area larger than an area of the region 115e.

As shown in FIG. 7, a first surface 115a is formed on an opposite side to the second surface 111a in the first layer 111. The first surface 115a is not covered by the luminous layer 113 and the second layer 112. The semiconductor layer 115 has a side surface 115c continuing to the first surface 115a.

Figure 9A:
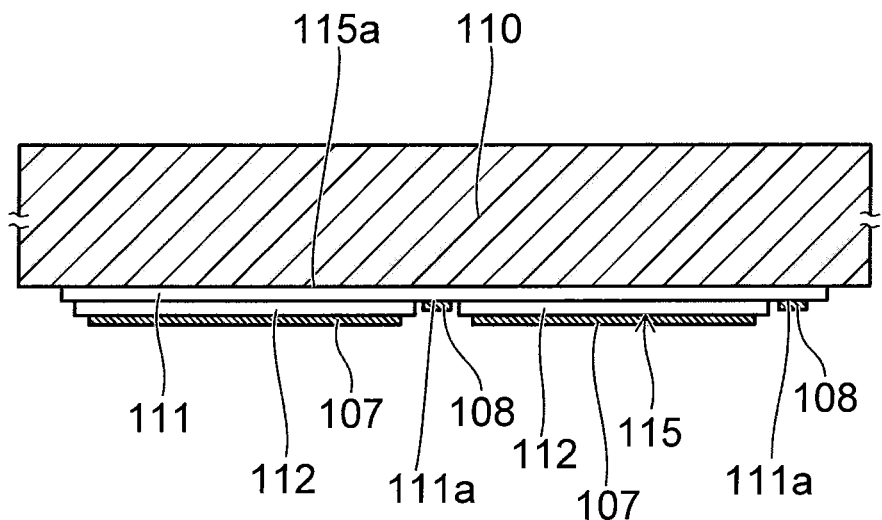
Figure 9B:
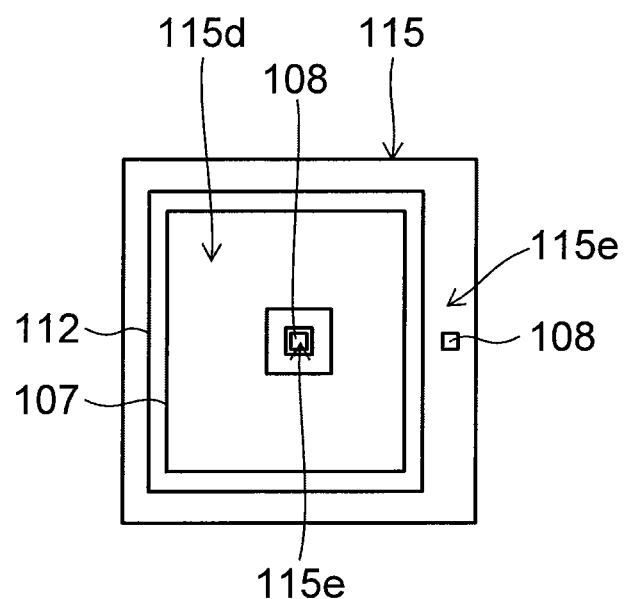

An n-side electrode 108 is provided on the second surface 111a of the first layer 111 and a p-side electrode 107 is provided on a surface of the second layer 112, as shown in FIG. 9A and FIG. 9B corresponding to a bottom view with respect to FIG. 9A. The p-side electrode 107 and the n-side electrode 108 are formed within a region (chip region) overlapped with the semiconductor layer 115.

The p-side electrode 107 has an area larger than an area of the n-side electrode 108 in a plan view of FIG. 9B. A contact area of the p-side electrode 107 and the second layer 112 is larger than a contact area of the n-side electrode 107 and the first layer 111.

Figure 10A:
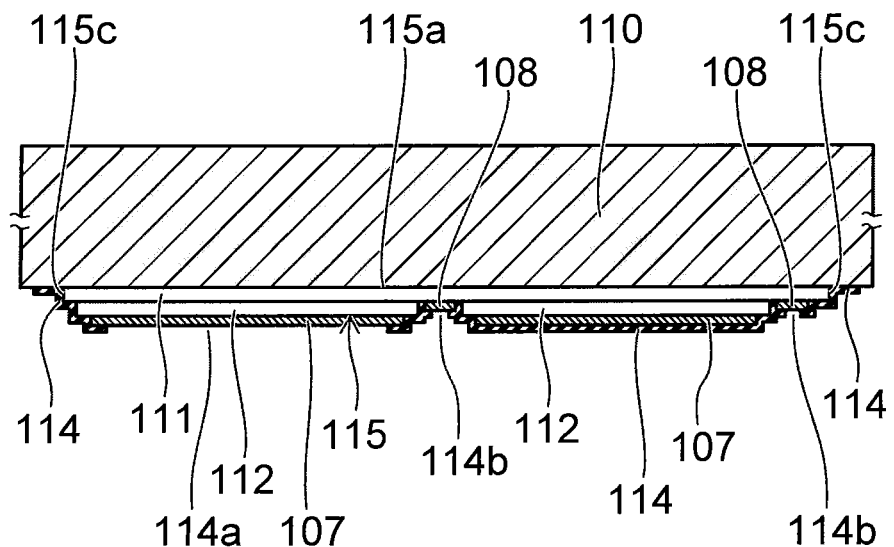
Figure 10B:
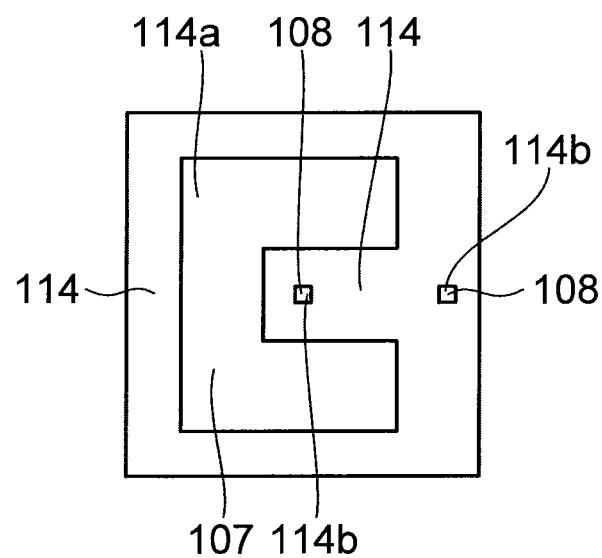

An insulating film 114 is provided on surfaces of the semiconductor layer 115 excluding the first surface 115a, as shown in FIG. 10A and FIG. 10B corresponding to a bottom view with respect to FIG. 10A. The insulating film 114 is an inorganic film, and for example, may be a silicon oxide film.

A first opening 114a and a second opening 114b are formed on the insulating film 114. The first opening 114a exposes the p-side electrode 107 and the second opening 114b exposes the n-side electrode 108. For example, two second openings 114b on an n-side are spaced and formed. The insulating film 114 covers a surface of the p-side electrode 107 between the two second openings 114b.

The insulating film 114 covers the side surface 115c of the first layer 111, a side surface of the second layer 112, and a side surface of the luminous layer 113.

Figure 11A:
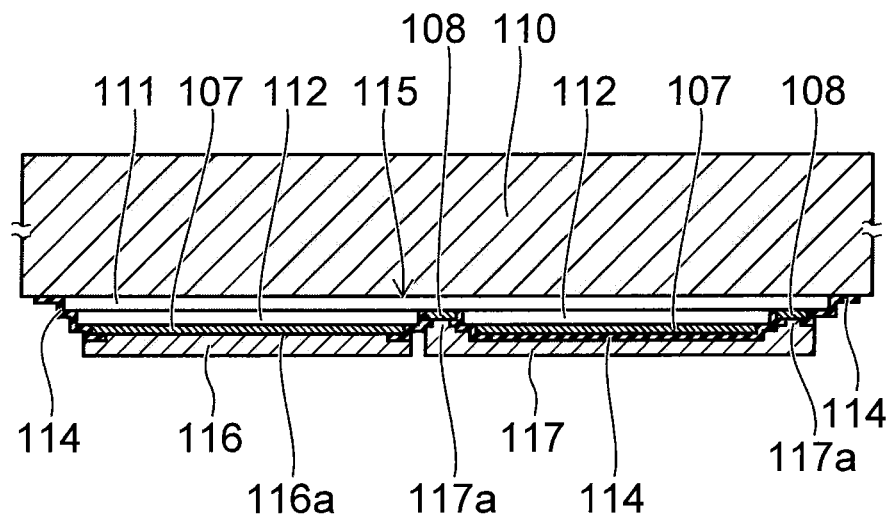
Figure 11B:
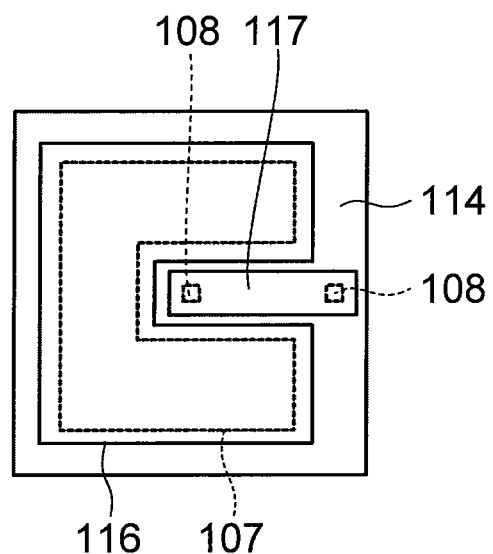

A first p-side interconnection layer 116 and a first n-side interconnection layer 117 are provided on an opposite side to the first surface 115a of the semiconductor layer 115, as shown in FIG. 11A and FIG. 11B corresponding to a bottom view with respect to FIG. 11A.

The first p-side interconnection layer 116 is formed within a region (chip region) overlapped with the semiconductor layer 115. The first p-side interconnection layer 116 is also provided in the first opening 114a and comes into contact with the p-side electrode 107. The first p-side interconnection layer 116 is connected to the p-side electrode 107 through a contact portion 116a integrally formed in the first opening 114a. The first p-side interconnection layer 116 does not come into contact with the first layer 111.

The first n-side interconnection layer 117 is formed within a region (chip region) overlapped with the semiconductor layer 115. The first n-side interconnection layer 117 is also provided in the second opening 114b and comes into contact with the n-side electrode 108. The first n-side interconnection layer 117 is connected to the n-side electrode 108 through a contact portion 117a integrally formed in the second opening 114b.

The first n-side interconnection layer 117 extends in a direction of joining two island-shaped n-side electrodes 108 to be formed with a line-patterned shape. The insulating film 114 is provided between a portion of the first n-side interconnection layer 117 which is positioned between two n-side electrodes 108 and the p-side electrode 107 and between the portion of the first n-side interconnection layer 117 which is positioned between the two n-side electrodes 108 and the second layer 112. The first n-side interconnection layer 117 does not come into contact with the p-side electrode 107 and the second layer 112.

As shown in FIG. 8B, the luminous region 115d including the luminous layer 113 occupies most of a planar region of the semiconductor layer 115. As shown in FIG. 9B, the p-side electrode 107 connected to the luminous region 115d has an area larger than an area of the n-side electrode 108. Accordingly, it is possible to obtain a wide luminous surface and to obtain high output of light.

Figure 18A:
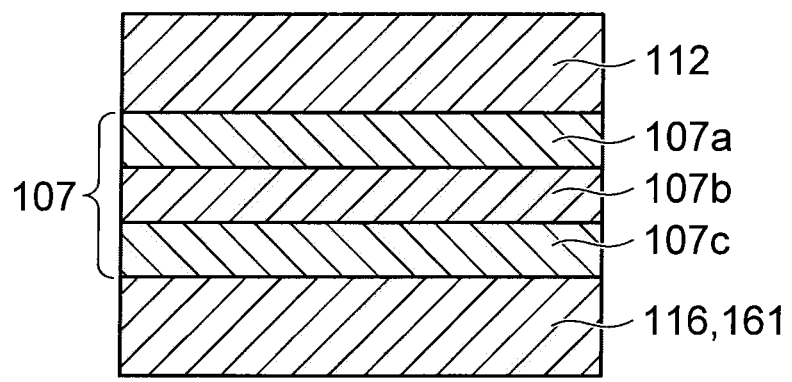
FIG. 18A and FIG. 18B are enlarged schematic cross-sectional views of a part of the semiconductor device of the another embodiment.

The p-side electrode 107 is provided between the second layer 112 and the first p-side interconnection layer 116. As shown in FIG. 18A, the p-side electrode 107 is a stacked film of a plurality of layers (for example, three layers). The p-side electrode 107 includes a first film 107a, a second film 107b, and a third film 107c which are provided in order from the second layer 112.

For example, the first film 107a is a silver (Ag) film which has high reflectance with respect to light emitted from the luminous layer 113 and a fluorescence layer 130. For example, the second film 107b is a titanium (Ti) film and the third film 107c is a platinum (Pt) film.

Figure 18B:
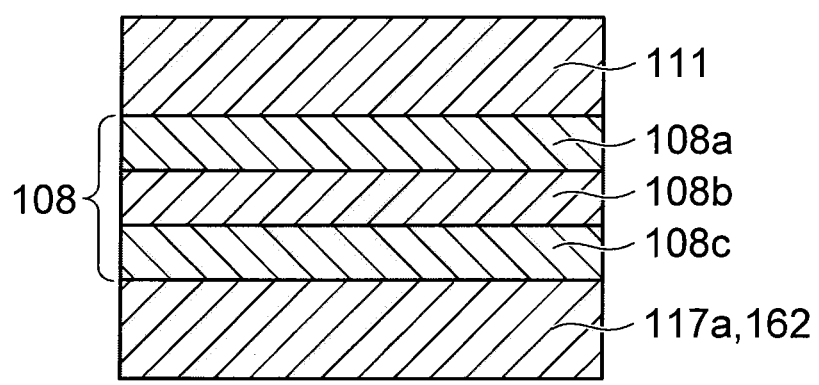

The n-side electrode 108 is provided between the first layer 111 and the contact portion 117a of the first n-side interconnection layer 117. As shown in FIG. 18B, the n-side electrode 108 is a stacked film of a plurality of layers (for example, three layers). The n-side electrode 108 includes a first film 108a, a second film 108b, and a third film 108c which are provided in order from the first layer 111.

For example, the first film 108a is an aluminum (Al) film which has high reflectance with respect to light emitted from the luminous layer 113 and the fluorescence layer 130. For example, the second film 108b is a titanium (Ti) film and the third film 108c is a platinum (Pt) film.

Figure 12A:
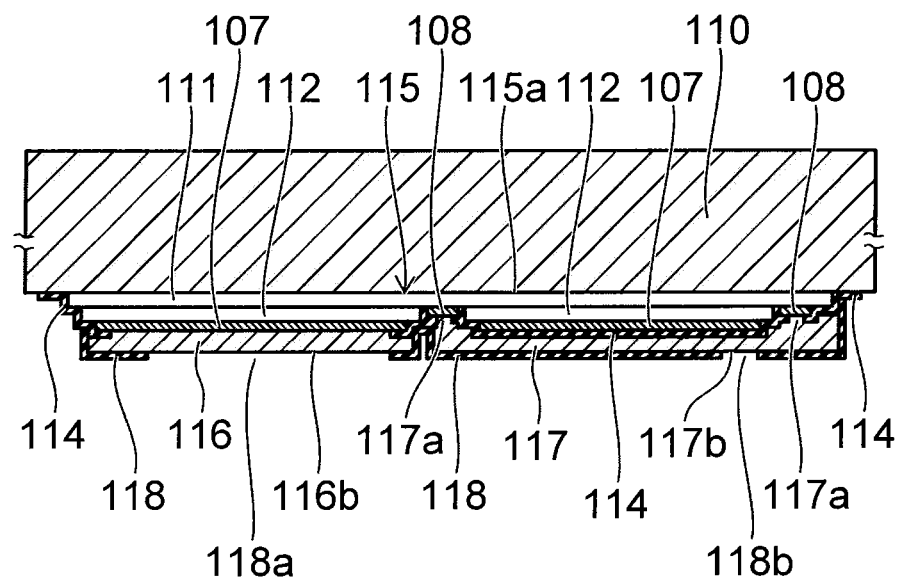
Figure 12B:
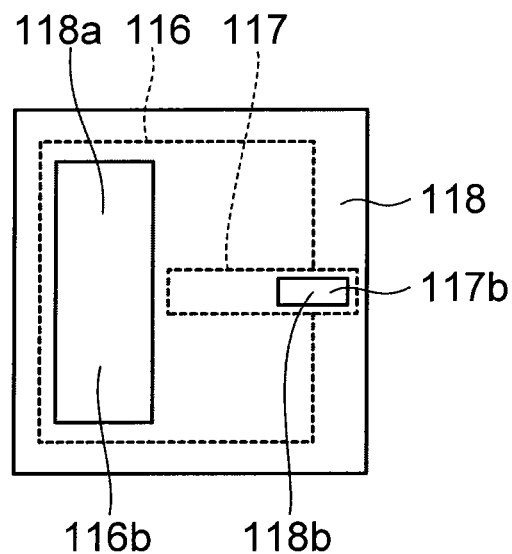

As shown in FIG. 12A and FIG. 12B corresponding to a bottom view with respect to FIG. 12A, an insulating film 118 is provided on surfaces of the first p-side interconnection layer 116 and the first n-side interconnection layer 117. The insulating film 118 is also provided between the first p-side interconnection layer 116 and the first n-side interconnection layer 117. For example, the insulating film 118 is an inorganic film and may be a silicon oxide film.

A first opening 118a and a second opening 118b are formed on the insulating film 118. The first opening 118a exposes a portion of the first p-side interconnection layer 116 (p-side pad 116b). The second opening 118b exposes a portion of the first n-side interconnection layer 117 (n-side pad 17b).

The p-side pad 116b has an area larger than an area of the n-side pad 117b. The area of the n-side pad 117b is larger than a contact area of the first n-side interconnection layer 117 and the n-side electrode 108.

The substrate 110 on the first surface 115a is removed as will be described later. An optic layer is provided on the first surface 115a on which the substrate 110 is removed. The optic layer serves to give emitted light of the semiconductor device desired optical characteristics. For example, as shown in FIG. 5, the fluorescence layer 130 is provided on the first surface 115a of the semiconductor layer 115 and a transparent layer (first transparent layer) 133 is provided on the fluorescence layer 130.

The fluorescence layer 130 contains a plurality of phosphors 131 which are particles. The phosphor 131 is excited by radiation light of the luminous layer 113 thereby radiating light with a wavelength different from that of the radiation light. The plurality of phosphors 131 are dispersed in a binder 132. The binder 132 causes the radiation light of the luminous layer 113 and radiation light of the phosphor 131 to pass through the binder 132. Here, a meaning of "passing through" is not limited to 100% of transmittance and includes a case of absorbing some of the light. For example, a transparent resin such as a silicone resin may be used as the binder 132.

The transparent layer 133 does not contain phosphor particles. The transparent layer 133 protects the fluorescence layer 130 when performing abrasiveness on a surface of the insulating member 127 which will be described later.

Additionally, the transparent layer 133 functions as a light scattering layer. That is, the transparent layer 133 includes a plurality of scatterers (for example, silicon oxide and a titanium compound) and a binder (for example, a transparent resin). The scatterers are particles and cause the radiation light of the luminous layer 113 to be scattered. The binder causes the radiation light of the luminous layer 113 to pass through the binder.

The insulating member 127 is provided at an out-of-chip region outside a side surface of the semiconductor layer 115. The insulating member 127 is thicker than the semiconductor layer 115 and supports the semiconductor layer 115. The insulating member 127 covers the side surface of the semiconductor layer 115 through the insulating film 114.

The insulating member 127 is also provided on the outside of a side surface of the optic layer (fluorescence layer 130 and transparent layer 133) and covers the side surface of the optic layer.

The insulating member 127 is provided around the chip 103 and supports the chip 103. The chip 103 includes the semiconductor layer 115, the electrodes 107 and 108, the first interconnection layers (on-chip interconnection layer) 116 and 117, and the optic layer.

An upper surface 127a of the insulating member 127 and an upper surface of the transparent layer 133 form a flat surface. An insulating film 126 is provided on a back surface of the insulating member 127.

A second p-side interconnection layer 121 is provided on the first p-side pad 116b of the first p-side interconnection layer 116. The second p-side interconnection layer 121 comes into contact with the first p-side pad 116b of the first p-side interconnection layer 116 and is extended to the out-of-chip region. A portion of the second p-side interconnection layer 121 extended to the out-of-chip region is supported by the insulating member 127 through the insulating film 126.

The portion of the second p-side interconnection layer 121 is extended to a region overlapped with the first n-side interconnection layer 117 through the insulating film 118.

A second n-side interconnection layer 122 is provided on the first n-side pad 117b of the first n-side interconnection layer 117. The second n-side interconnection layer 122 comes into contact with the first n-side pad 117b of the first n-side interconnection layer 117 and is extended to the out-of-chip region. A portion of the second n-side interconnection layer 122 extended to the out-of-chip region is supported by the insulating member 127 through the insulating film 126.

Figure 17A:
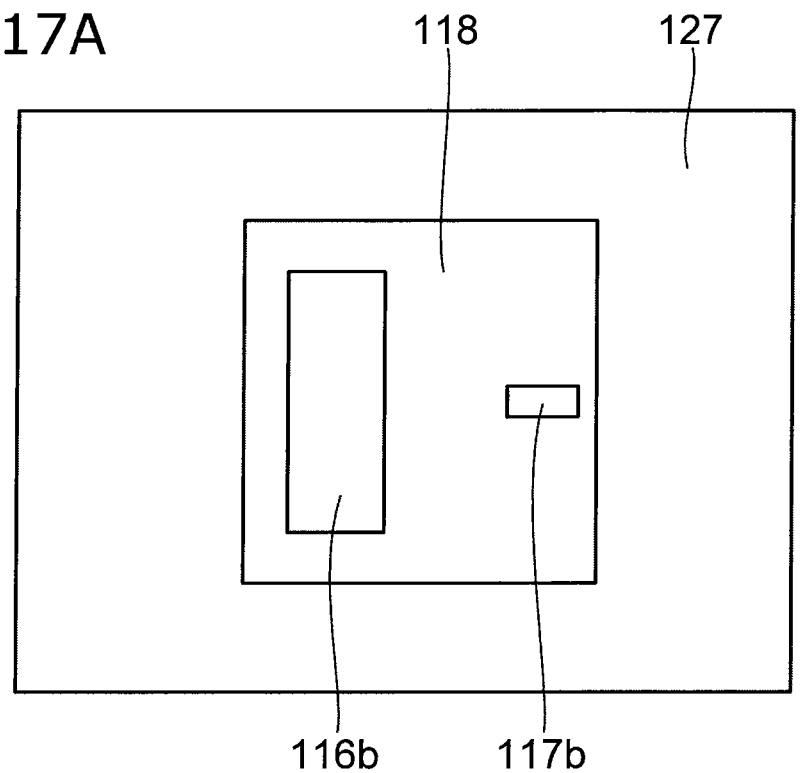
Figure 17B:
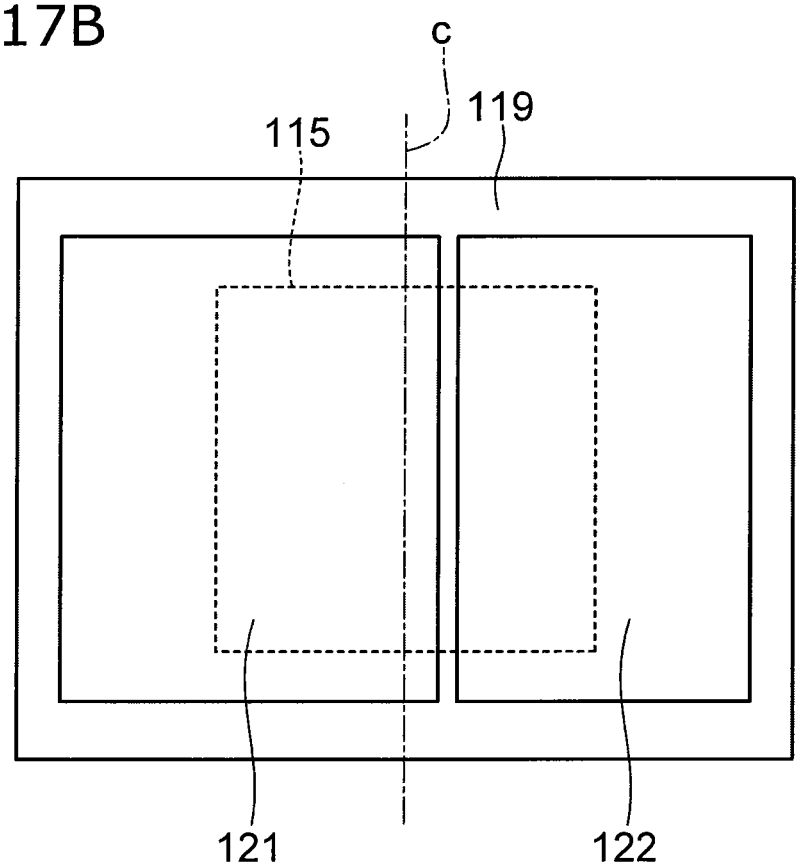

FIG. 17B shows an example of a planar layout of the second p-side interconnection layer 121 and the second n-side interconnection layer 122.

The second p-side interconnection layer 121 and the second n-side interconnection layer 122 are disposed to be asymmetrical to a center line c which divides the planar region of the semiconductor layer 115 into two equal parts. A lower surface (surface on a side of the mount surface) of the second p-side interconnection layer 121 is wider than a lower surface of the second n-side interconnection layer 122.

As shown in FIG. 5, an insulating film 119 is provided on surfaces of the second p-side interconnection layer 121 and the second n-side interconnection layer 122. The insulating film 119 is, for example, an inorganic film and may be a silicon oxide film.

Figure 14:
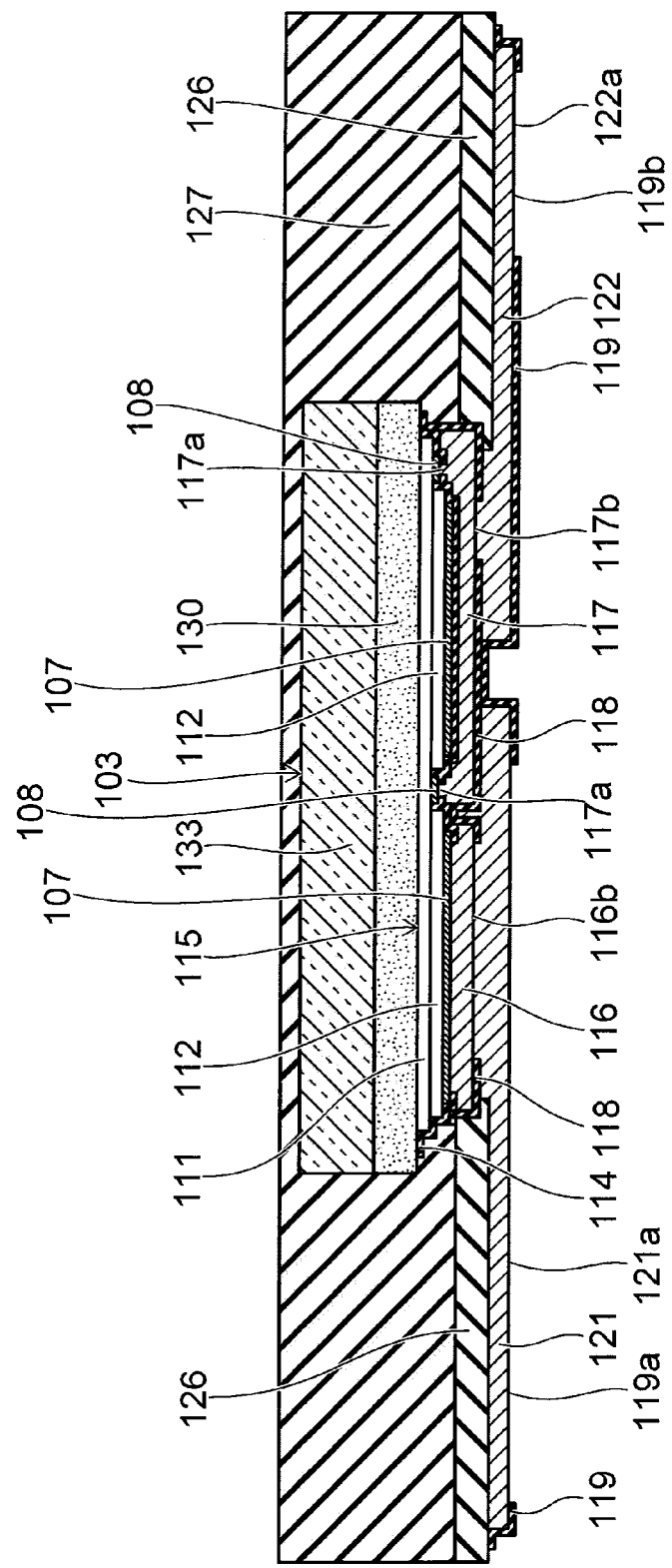

A first opening 119a and a second opening 119b are formed on the insulating film 119, as shown in FIG. 14. The first opening 119a exposes a second p-side pad 121a of the second p-side interconnection layer 121. The second opening 119b exposes a second n-side pad 122a of the second n-side interconnection layer 122.

A p-side external connection electrode 123 is provided on the second p-side pad 121a of the second p-side interconnection layer 121, as shown in FIG. 5. The p-side external connection electrode 123 comes into contact with the second p-side pad 121a of the second p-side interconnection layer 121 and is provided on the second p-side interconnection layer 121.

A portion of the p-side external connection electrode 123 is provided at a region overlapped with the first n-side interconnection layer 117 through the insulating films 118 and 119 and at a region overlapped with the second n-side interconnection layer 122 through the insulating film 119.

The p-side external connection electrode 123 is extended to the chip region overlapped with the semiconductor layer 115 and to the out-of-chip region. The p-side external connection electrode 123 is thicker than the first p-side interconnection layer 116 and also thicker than the second p-side interconnection layer 121.

An n-side external connection electrode 124 is provided on the second n-side pad 122a of the second n-side interconnection layer 122. The n-side external connection electrode 124 is disposed at the out-of-chip region and comes into contact with the second n-side pad 122a of the second n-side interconnection layer 122.

The n-side external connection electrode 124 is thicker than the first n-side interconnection layer 117 and also thicker than the second n-side interconnection layer 122.

A resin layer (insulating layer) 125 is provided between the p-side external connection electrode 123 and the n-side external connection electrode 124. The resin layer 125 comes into contact with a side surface of the p-side external connection electrode 123 and a side surface of the n-side external connection electrode 124. The resin layer 125 fills a space between the p-side external connection electrode 123 and the n-side external connection electrode 124.

The resin layer 125 is provided around the p-side external connection electrode 123 and around the n-side external connection electrode 124. The resin layer 125 covers a side surface of the p-side external connection electrode 123 and a side surface of the n-side external connection electrode 124.

The resin layer 125 makes the p-side external connection electrode 123 and the n-side external connection electrode 124 have a high mechanical strength. The resin layer 125 functions as solder-resist which prevents solder from widening in mounting of the semiconductor device.

A lower surface of the p-side external connection electrode 123 is exposed by the resin layer 125 and functions as a p-side mount surface (p-side external terminal) 123a connectable to an external circuit such as a mount substrate. A lower surface of the n-side external connection electrode 124 is exposed by the resin layer 125 and functions as an n-side mount surface (n-side external terminal) 124a connectable to an external circuit such as a mount substrate. The p-side mount surface 123a and the n-side mount surface 124a are bonded to a land pattern of the mount substrate through, for example, solder or a conductive bonding material.

Here, it is desired that the p-side mount surface 123a and the n-side mount surface 124a be protruded more than a surface of the resin layer 125. Accordingly, it is possible to stabilize a shape of solder at a contact portion at the time of mounting and to improve reliability in mounting.

FIG. 6 shows an example of a planar layout of the p-side mount surface 123a and the n-side mount surface 124a.

The p-side mount surface 123a and the n-side mount surface 124a are disposed to be asymmetrical to the center line c which divides the planar region of the semiconductor layer 115 into two equal parts. The p-side mount surface 123a is wider than the n-side mount surface 124a.

A space between the p-side mount surface 123a and the n-side mount surface 124a is set to be a space which is positioned between the p-side mount surface 123a and the n-side mount surface 124a and is not bridged by solder at the time of mounting.

The first n-side interconnection layer 117 and the second n-side interconnection layer 122 cause an electrode contact surface (second surface 111a of the first layer 111) on the n-side in the semiconductor layer 115 to be rearranged at a wide region including the out-of-chip region. With this, it is possible to secure enough of an area of the n-side mount surface 124a for mounting with high reliability and to reduce an area of an n-side electrode surface in the semiconductor layer 115. Accordingly, it is possible to reduce an area of the region 115e which does not include the luminous layer 113 in the semiconductor layer 115 and to widen an area of the region 115d including the luminous layer 113, thereby improving output of light.

According to still another embodiment, a p-side metal layer 171 and an n-side metal layer 172 are provided on a side of the mount surface. The p-side metal layer 171 includes the first p-side interconnection layer 116, the second p-side interconnection layer 121, and the p-side external connection electrode 123. The n-side metal layer 172 includes the first n-side interconnection layer 117, the second n-side interconnection layer 122, and the n-side external connection electrode 124.

The semiconductor layer 115 is formed on a substrate by using an epitaxial growth method. The substrate is removed and the semiconductor layer 115 does not include the substrate on a side of the first surface 115a. It is possible for the semiconductor device to have a reduced thickness by removing the substrate. In addition, it is possible to form minute unevenness on the first surface 115a of the semiconductor layer 115 by removing the substrate and to improve light extraction efficiency.

The semiconductor layer 115 is supported on a support. The support is made of a composite of the metal layers 171 and 172 and the resin layer 125. The semiconductor layer 115 is supported from a side of a side surface by the insulating member 127 which is, for example, a resin layer thicker than the semiconductor layer 115.

For example, silver, gold, nickel, copper, and the like may be used as a material of the metal layers 171 and 172. If copper is used among these, it is possible to improve good thermal conductivity, high migration resistance and high adhesion to an insulating material.

Stress is applied to the semiconductor layer 115 by a heat cycle in mounting of a semiconductor device. The stress is generated by solder and the like which causes the p-side mount surface 123a and the n-side mount surface 124a to be bonded to a land of the mount substrate. The p-side external connection electrode 123, the n-side external connection electrode 124 and the resin layer 125 are formed to have an appropriate thickness (height) and thus it is possible for the p-side external connection electrode 123, the n-side external connection electrode 124, and the resin layer 125 to absorb and relieve the stress. Particularly, the resin layer 125 which is more flexible than the semiconductor layer 115 is used on a side of the mount surface as a part of the support, and thus it is possible to increase an effect of stress relaxation.

The metal layers 171 and 172 contain, for example, copper which has a high thermal conductivity as a main component. A high thermal conductor is widely spread at a region overlapped with the luminous layer 113 to have a large area. Heat generated in the luminous layer 113 dissipates to the mount substrate through the metal layers 171 and 172 with a short path formed downward of the chip.

Particularly, the p-side mount surface 123a of the p-side metal layer 171 connected with the luminous region 115d of the semiconductor layer 115 is almost overlapped with the planar region of the semiconductor layer 115 in a plan view shown in FIG. 6. Accordingly, it is possible to dissipate the heat to the mount substrate through the p-side metal layer 171 with high efficiency.

According to still another embodiment, the p-side mount surface 123a is expanded to the out-of-chip region. Accordingly, it is possible to increase a planar size of solder bonded to the p-side mount surface 123a and to improve a heat dissipation property to the mount substrate through solder.

The second n-side interconnection layer 122 is extended to the out-of-chip region. Thus, it is possible to dispose the n-side mount surface 124a at the out-of-chip region without a constraint of the p-side mount surface 123a which is subject to layout in order to occupy most of a region overlapped with the chip. It is possible to increase an area of the n-side mount surface 124a by disposing the n-side mount surface 124a at the out-of-chip region, compared to a case in which the n-side mount surface 124a is subject to lay-out to be only within a chip region.

Accordingly, it is possible to also increase a planar size of solder bonded to the n-side mount surface 124a and to also improve a heat dissipation property to the mount substrate through solder on the n-side.

Light is radiated from the luminous layer 113 to the first surface 115a. The light is incident to the fluorescence layer 130. Some of the light excites the phosphor 131. The light from the luminous layer 113 and fluorescence from the phosphor 131 are mixed to obtain white light, for example.

The light radiated from the luminous layer 113 to the mount surface is reflected from the p-side electrode 107 and the n-side electrode 108 to travel to the upward fluorescence layer 130.

The transparent layer (first transparent layer) 133 is provided on the fluorescence layer 130. A transparent layer (second transparent layer) 134 is provided on the transparent layer 133 and on the insulating member 127 at the out-of-chip region.

The transparent layer 134 contains a plurality of scatterers which are particles (for example, silicon oxide) and a binder (for example, a transparent resin). The scatterer scatters the radiation light from the luminous layer 113. The binder causes the radiation light from the luminous layer 113 to pass through the binder.

The transparent layer 134 functions as a light scattering layer. The transparent layer 134 which is the light scattering layer has an area larger than an area of the fluorescence layer 130 and an area of the transparent layer 133. That is, the transparent layer 134 has the area larger than an area of the chip 103. Accordingly, it is possible to widen a range of light emission from the semiconductor device to the outside of the semiconductor device and to have a wide angle of light distribution characteristics.

A surface of a portion of the insulating member 127 near to at least the side surface of the semiconductor layer 115 has reflexibility with respect to the radiation light from the luminous layer 113. A portion of the insulating member 127 near to the side surface of the fluorescence layer 130 and a portion of the insulating member 127 near to the side surface of the transparent layer 133 have reflexibility with respect to the radiation light from the luminous layer 113 and radiation light from the phosphor 131. The vicinity or a boundary between the insulating member 127 and the transparent layer 134 has reflexibility with respect to the radiation light from the luminous layer 113 and the radiation light from the phosphor 131.

For example, the insulating member 127 is a resin layer having reflectance of 50% or more with respect to the radiation light from the luminous layer 113 and the radiation light from the phosphor 131.

Accordingly, it is possible to reflect radiation light from the side surface of the chip 103 and light which is scattered in the transparent layer 134 to travel to the insulating member 127 from the insulating member 127. It is possible to reduce absorption loss of the light in the insulating member 127 and to increase light extraction efficiency to the outside of the semiconductor device through the transparent layer 134.

The fluorescence layer 130 is formed on the first surface 115a of the semiconductor layer 115 by a wafer level process. The fluorescence layer 130 has substantially the same area as an area of the semiconductor layer 115 or a little larger than the area of the semiconductor layer 115.

The fluorescence layer 130 is not formed around a side of the side surface of the semiconductor layer 115 and a side of the mount surface. That is, the fluorescence layer 130 is not formed uselessly on the side of the side surface of the chip and the side of the mount surface in which light is not emitted outwardly and thus a reduction in cost is obtained.

An LED chip is mounted on a mount substrate through a bump or the like, and then a fluorescence layer is formed in order to cover the entirety of the chip in general mounting of a flip chip. Additionally, a space between bumps is under-filled with a resin.

On the other hand, according to the semiconductor device of the other embodiment, the resin layer 125 different from the fluorescence layer 130 is provided around the p-side external connection electrode 123 and around the n-side external connection electrode 124 in a state before mounting shown in FIG. 5 and thus it is possible to give the side of the mount surface characteristics suitable for stress relaxation. Since the resin layer 125 has already been provided on the side of the mount surface, under-filling after mounting is not required.

An optic layer is provided on a side of the first surface 115a of the semiconductor layer 115. The optic layer is designed preferentially considering light extraction efficiency, color conversion efficiency, light distribution characteristics, and the like. A layer is provided on the side of the mount surface and the layer is designed preferentially considering stress relaxation in mounting or characteristics of the layer as a support instead of a substrate. For example, the resin layer 125 has a structure in which a resin as a base is filled with filler such as silica particles with high density. The resin layer 125 is reconstructed to have hardness suitable for a support.

According to the other embodiment described above, the semiconductor layer 115, the electrodes 107 and 108, the on-chip interconnection layers 116 and 117, and the optic layer are collectively formed at a wafer level. Accordingly, it is possible to realize a chip-sized device 103 with low cost. In addition, the external terminals (mount surface) 123a and 134a are expanded to the out-of-chip region, and thus it is possible to improve a heat dissipation property. Consequently, it is possible to provide a semiconductor device having low cost and high reliability.

According to the embodiment, as viewed in the upper surface of the semiconductor chip 103, the ratio R of the area of the chip 103 to an area of a portion at which only the insulating member 127 (insulating layer) is provided is other than an integer multiple, for example, not less than 2.2 times and not more than 3.8 times excluding three times.

As will be described later, the pitch between the plurality of chips 103 before dicing may be set to be other than an integer multiple of the chip width of the chip 103. With this, it is possible to freely set the ratio R of the area and thereby it is possible to improve the degree of freedom when a structure of a semiconductor device is designed.

The chip 103 is a square shape in a plane view and has four corner portions. The insulating member 127 surrounding the chip 103 also has four corner portions. According to the above-described semiconductor device shown in FIG. 1B, a diagonal line of the chip 103 and a diagonal line of the insulating member 127 are shifted from each other in order not to match each other. The corner portion of the chip 103 does not face the corner portion of the insulating member 127 but faces a side portion of the insulating member 127. The corner portion of the chip 103 may have, for example, a sharp shape and a round shape.

For example, a first corner portion and a second corner portion among the four corner portions of the chip 103 are joined to form a diagonal line. The second corner portion is positioned to be an opposite angle to the first corner portion. The diagonal line crosses, for example, another diagonal line. The other diagonal line is formed by joining a third corner portion and a fourth corner portion among the four corner portions of the insulating member 127. The third corner portion is nearest to the first corner portion of the chip 103. The fourth corner portion is nearest to the second corner portion of the chip 103. The diagonal line and the other diagonal line are crossed to form an acute angle. The angle θ of the acute angle is, for example, not smaller than 0° and not larger than 15°. Two sides of the chip 103 forming the corner portion extend and cross to make a point. The point is set as a reference point in the diagonal line when the corner portions have a round shape. Additionally, a side of the chip 103 is not parallel with a side of a package which corresponds to the side of the chip 103 but inclined to form an acute angle (not larger than 15°). When the chip 103 has four sides, the four sides cause an acute angle (not larger than 15°) to be formed, respectively.

Even though stress is applied from the outside of an individualized semiconductor device to the corner portion of the insulating member 127 which is packaged, a position of the corner portion of the chip 103 is shifted from a position of the corner portion of the insulating member 127 in the individualized semiconductor device, and thus it is possible to disperse the stress applied to the corner portion of the insulating member 127 and it is possible to improve reliability in the semiconductor device.

A manufacturing method of the semiconductor device according to the other embodiment will be described with reference to FIG. 8A to FIG. 17B.

FIG. 8B, FIG. 9B, FIG. 10B, FIG. 11B, FIG. 12B, FIG. 17A, and FIG. 17B correspond to bottom view with respect to FIG. 8A, FIG. 9A, FIG. 10A, FIG. 11A, FIG. 12A, FIG. 13, and FIG. 14, respectively.

The semiconductor layer 115 is obtained by epitaxial growing on the substrate 110 by using a metal organic chemical vapor deposition (MOCVD) method, for example. The substrate 110 may be a silicon substrate. The substrate 110 may be a sapphire substrate or a silicon carbide substrate. The semiconductor layer 115 may be a nitride semiconductor layer containing gallium nitride (GaN).

A stacked film of the second layer 112 and the luminous layer 113 is selectively etched by using a reactive ion etching (RIE) method, for example. The second surface 111a of the first layer 111 is exposed, as shown in FIGS. 8A and 8B.

The first layer 111 is selectively removed and the substrate 110 is separated into a plurality of the semiconductor layers 115. A groove separating the semiconductor layer 115 into being plural is formed with a lattice pattern, for example.

As shown in FIGS. 9A and 9B, the p-side electrode 107 is formed on a surface of the second layer 112 and the n-side electrode 108 is formed on the second surface 111a of the first layer 111.

As shown in FIGS. 10A and 10B, the insulating film 114 is formed to cover the semiconductor layer 115 and the electrodes 107 and 108. Then, the first opening 114a and the second opening 114b are formed on the insulating film 114.

As shown in FIGS. 11A and 11B, the first p-side interconnection layer 116 and the first n-side interconnection layer 117 are formed. The first p-side interconnection layer 116 is formed in the first opening 114a and comes into contact with the p-side electrode 107.

The first n-side interconnection layer 117 is formed in the second opening 114b and comes into contact with the n-side electrode 108. The first n-side interconnection layer 117 comes into contact with the n-side electrode 108 at two locations. The first n-side interconnection layer 117 is extended in a direction obtained by joining two portions of the n-side electrode 108 at the two locations, and thus the first n-side interconnection layer 117 is formed with a line shape. The insulating film 114 is interposed between a portion of the first n-side interconnection layer 117 formed with the line shape and the p-side electrode 107, and thus the first n-side interconnection layer 117 does not come into contact with the p-side electrode 107.

The p-side electrode 107, the n-side electrode 108, the first p-side interconnection layer 116, and the first n-side interconnection layer 117 are formed within a region overlapped with the semiconductor layer 115.

As shown in FIGS. 12A and 12B, the insulating film 118 is formed on a surface of the first p-side interconnection layer 116 and a surface of the first n-side interconnection layer 117. The first opening 118a and the second opening 118b are formed on the insulating film 118. The first p-side pad 116b of the first p-side interconnection layer 116 is exposed in the first opening 118a and the first n-side pad 117b of the first n-side interconnection layer 117 is exposed in the second opening 118b.

Then, the substrate 110 is removed. A laminated body includes the semiconductor layer 115 and the interconnection layers 116 and 117. The substrate 110 is removed in a state where the laminated body is temporarily supported by a support (not shown).

The substrate 110 which is, for example, a silicon substrate is removed by dry-etching such as RIE. In addition, the silicon substrate 110 may be removed by wet-etching. The substrate 110 may be removed by a laser lift-off method in a case where the substrate 110 is a sapphire substrate.

The semiconductor layer 115 obtained by epitaxial growing on the substrate 110 contains large internal stress in some cases. The p-side metal layer 171, the n-side metal layer 172, and the resin layer 125 are formed of flexible materials compared to the semiconductor layer 115 formed of a GaN-based material, for example. Accordingly, the p-side metal layer 171, the n-side metal layer 172, and the resin layer 125 absorb the stress when the internal stress in epitaxial growth is released at once in separating of the substrate 110. Consequently, it is possible to avoid damage to the semiconductor layer 115 while the substrate 110 is removed.

The first surface 115a of the semiconductor layer 115 is exposed by removal of the substrate 110. The first surface 115a of the semiconductor layer 115 is roughened as necessary.

The above-described fluorescence layer 130 is formed on the first surface 115a. The transparent layer 133 is formed on the fluorescence layer 130. The processes for this are performed in a state of a wafer.

The wafer is subject to dicing and the plurality of chips 103 are individualized. The chip 103 is supported by, for example, the transfer source tape 31 according to the above-described embodiment. With this, selection of the transfer source tape 31 in accordance to dicing of the wafer is not required. That is, it is possible to select any one of kinds of transfer source tape 31.

The wafer may be supported by the transfer source tape 31 at this time, for example, before dicing. Accordingly, use of a new tape is not required after the plurality of chips 103 are individualized and it is possible to reduce cost and the number of processes.

Then, similarly to the manufacturing method according to the above-described embodiment, the chips 103 are rearranged. After that, as shown in FIG. 13, the insulating member (supporting member) 127 is formed on the surrounding of the chip 103 (out-of-chip region) and on the chip 103 (on the transparent layer 133) and then dicing is performed for each chip 103 including the insulating member 127.

Figure 13:
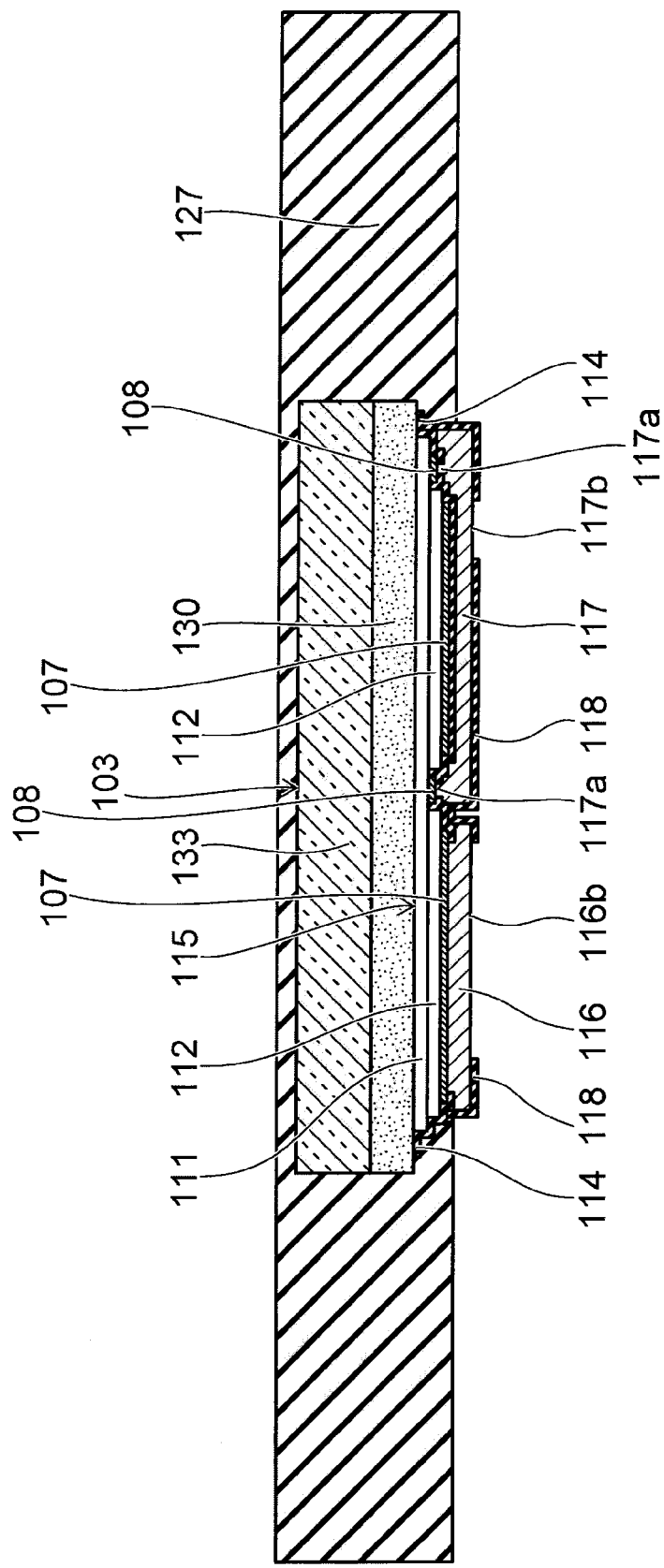

As shown in FIG. 14, the insulating film 126 is formed on a lower surface of the insulating member 127 in FIG. 13. Accordingly, it is possible to remove a level difference between the chip 103 and the insulating member 127 and to improve reliability of the interconnection layer which will be formed later. Various resin materials may be used for the insulating film 126 and, particularly, an imide-based resin, a phenol-based resin, a silicon-based resin, an epoxy-based resin, or the like which has high thermal resistance is suitable.

As shown in FIG. 14, the second p-side interconnection layer 121 is formed on the first p-side pad 116b of the first p-side interconnection layer 116 and on the insulating film 126 at the out-of-chip region. The second n-side interconnection layer 122 is formed on the first n-side pad 117b of the first n-side interconnection layer 117 and on the insulating film 126 at the out-of-chip region.

The second n-side interconnection layer 122 is positioned with respect to the chip 103. Because the first n-side pad 117b is rearranged with an area larger than that of the n-side electrode 108, it is possible for the second n-side interconnection layer 122 to reliably overlap and connect with the first n-side pad 117b even though the formation position of the second n-side interconnection layer 122 is shifted to the chip 103.

The insulating film 119 is formed on a surface of the second p-side interconnection layer 121 and on a surface of the second n-side interconnection layer 122. The first opening 119a and the second opening 119b are formed on the insulating film 119.

The second p-side pad 121a of the second p-side interconnection layer 121 is exposed in the first opening 119a. The second n-side pad 122a of the second n-side interconnection layer 122 is exposed in the second opening 119b.

Figure 15:
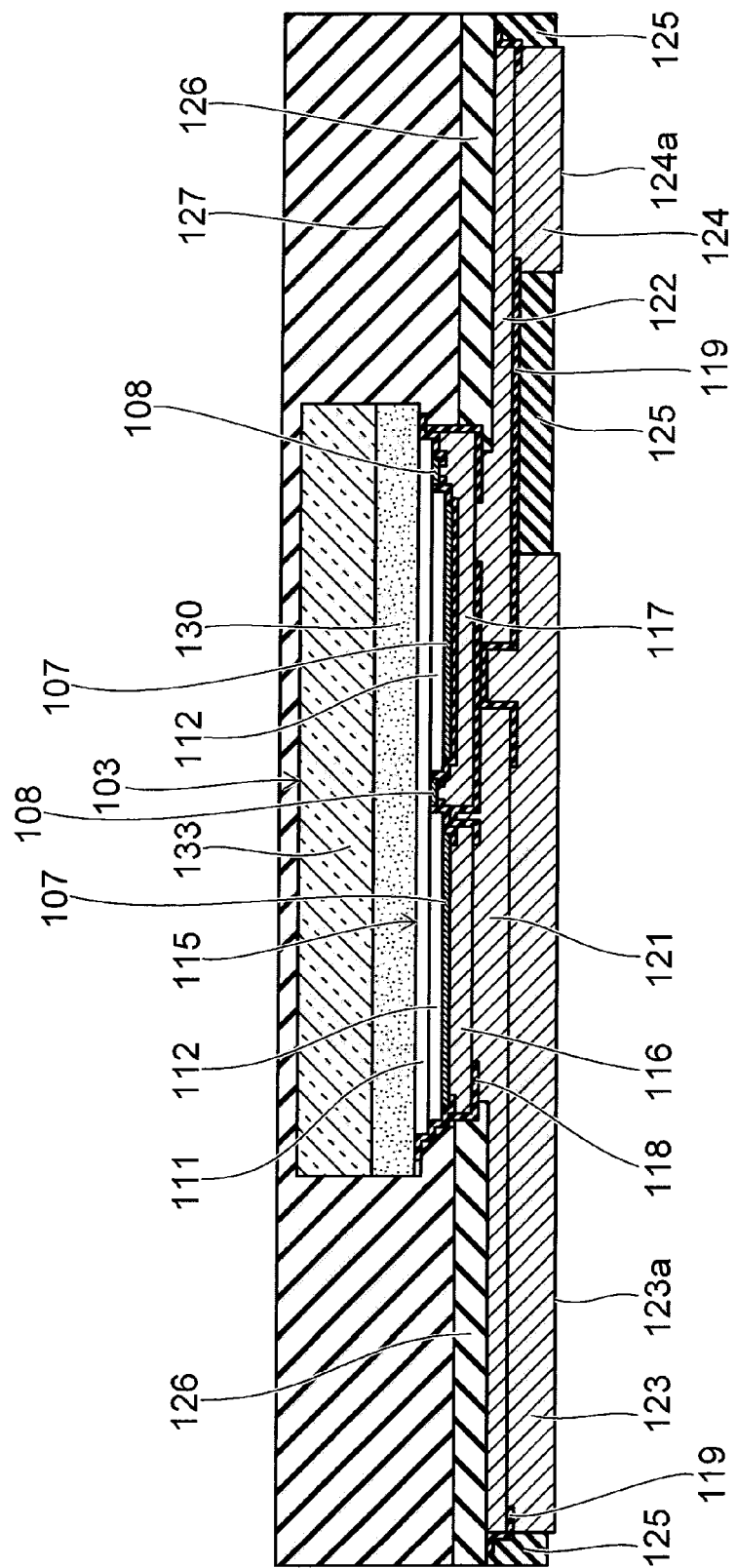

The p-side external connection electrode 123 is formed on the second p-side pad 121a, as shown in FIG. 15. The n-side external connection electrode 124 is formed on the second n-side pad 122a. The resin layer 125 is formed between the p-side external connection electrode 123 and the n-side external connection electrode 124, around the p-side external connection electrode 123, and around the n-side external connection electrode 124.

Figure 16:
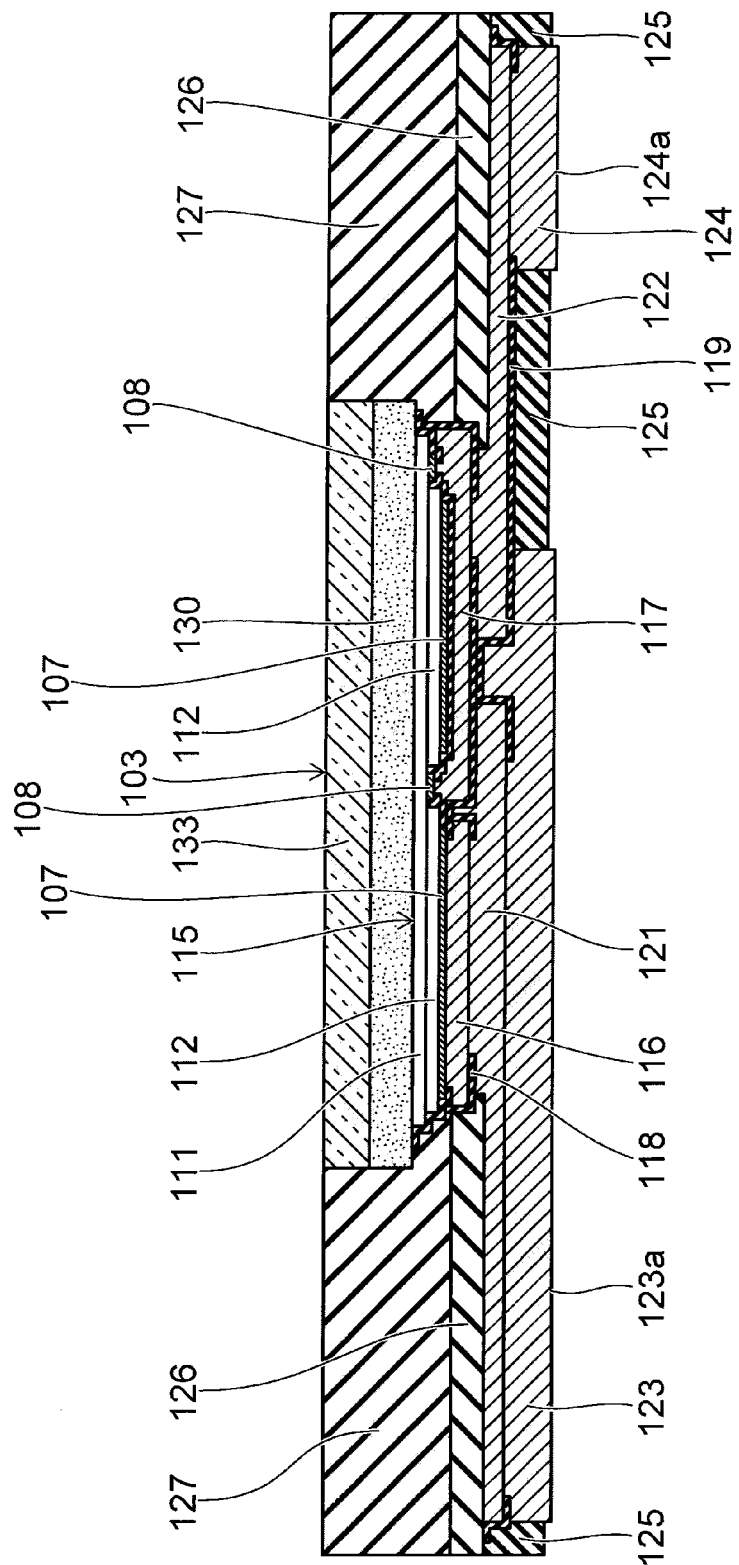

Then, abrasiveness is performed on an upper surface of the insulating member 127 on the transparent layer 133 and an upper surface of the insulating member 127 on the out-of-chip region. The insulating member 127 on the transparent layer 133 is removed. As shown in FIG. 16, an upper surface of the transparent layer 133 and the upper surface of the insulating member 127 on the out-of-chip region are planarized.

Abrasiveness is not performed to the height extent of exposing an upper surface of the fluorescence layer 130. The transparent layer 133 remaining on the fluorescence layer 130 protects the fluorescence layer 130.

The transparent layer (scattering layer) 134 is formed on the upper surface of the planarized transparent layer 133 and on the upper surface of the insulating member 127, as shown in FIG. 5. The transparent layer is formed to have a planar size larger than that of the chip 103.

According to this embodiment, similarly to the above-described embodiment, the pitch (second pitch) between the rearranged chips 103 may be set to be other than an integer multiple of the chip width of the chip 103 in a rearrangement process on the chip 103. For example, in the rearrangement process on the chip 103, the pitch between the rearranged chips 103 is limited to an integer multiple of the chip width when only the thinning method is used. On the other hand, according to the embodiment, it is possible for the pitch (second pitch) between the rearranged chips 103 to be set to a value finer than the pitch (integer multiple of the chip width) obtained when the thinning method is used.

Accordingly, it is possible to improve the degree of freedom in the pitch obtained when the chips 103 are rearranged. That is, it is possible to improve the degree of freedom in a ratio of a dimension of the chip 103 to a dimension of a package. For example, when a semiconductor device with a dimension of a package having a standardized constant size is manufactured, it is possible to freely select a chip size and to form the chip. It is possible to freely form a semiconductor device according to usage or performance, for example, a semiconductor device in which a ratio of the dimension of the chip 103 to the dimension of the package is sufficiently large and thus it is possible to sufficiently protect the chip 103, and a semiconductor device having a chip size large enough for high power.

According to the respective embodiments, for example, stretching and deformation of the second support causes the second pitch to be longer than the first pitch in the manufacturing method of the semiconductor device.

According to the respective embodiments, for example, the second pitch is longer than an integer multiple of the length of the semiconductor chip and is not more than 1.2 times an integer multiple of the length of the semiconductor chip in the manufacturing method of the semiconductor device.

According to the respective embodiments, for example, the second pitch is shorter than an integer multiple of the length of the semiconductor chip and is not less than 0.8 times an integer multiple of the length of the semiconductor chip in the manufacturing method of the semiconductor device.

According to the respective embodiments, for example, an acute angle is formed by causing a diagonal line of the semiconductor chip and a diagonal line of the insulating layer to cross and the acute angle is larger than 0° and not larger than 15° in the manufacturing method of the semiconductor device.

According to the respective embodiments, for example, an acute angle is formed by causing a diagonal line of the semiconductor chip and a diagonal line of the insulating layer to cross and the acute angle is larger than 0° and 15° or smaller in the semiconductor device.

According to the respective embodiments, for example, as viewed in the upper surface of the semiconductor chip, the ratio of an area of the semiconductor chip to an area of a portion at which only a resin layer is provided is not less than 2.2 times and not more than 3.8 times excluding three times in the semiconductor device.

According to the respective embodiments, for example, a diagonal line joining a first corner portion and a second corner portion of the semiconductor chip and a diagonal line joining a third corner portion and a fourth corner portion of the resin layer cross, the third corner portion is nearest to the first corner portion of the semiconductor chip, and the fourth corner portion is nearest to the second corner portion of the semiconductor chip in the resin layer in the semiconductor device.

According to the respective embodiments, the semiconductor device includes a semiconductor chip and an insulating layer which is provided around the semiconductor chip and covers the semiconductor chip. As viewed in the upper surface of the semiconductor chip, ratio of an area of the semiconductor chip to an area of a portion at which only the insulating layer is provided is other than an integer multiple. The ratio of the area of the semiconductor chip to the area of the portion at which only the insulating layer is provided is not less than 2.2 times and not more than 3.8 times excluding three times.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A manufacturing method of a semiconductor device comprising:
    transferring a first group from a first support to a second support, the first group selected from a plurality of semiconductor chips supported by the first support, the plurality of semiconductor chips arranged in an initial pitch, the first group arranged in a first pitch being longer than the initial pitch;
    deforming the second support to convert each pitch of the semiconductor chips in the first group transferred on the second support into a second pitch different from the first pitch;
    forming an insulating layer around each of the semiconductor chips, the insulating layer covering each of the semiconductor chips in the first group arranged in the second pitch; and
    dicing the insulating layer.

2. The method according to claim 1, wherein the second pitch is made shorter than the first pitch by thermal-processing and deforming the second support.

3. The method according to claim 1, wherein the second pitch is shorter than an integer multiple of a length of the semiconductor chips and 0.8 times or more the integer multiple of the length of the semiconductor chips.

4. The method according to claim 1, wherein the dicing of the insulating layer includes dicing the insulating layer along a dicing line inclined with respect to a side of the semiconductor chip.

5. The method according to claim 1, further comprising:
    transferring a second group from the first support to the third support, the second group selected from the plurality of semiconductor chips supported by the first support, the plurality of semiconductor chips arranged in the initial pitch, the second group arranged in an third pitch being longer than the initial pitch;
    deforming the third support to convert each pitch of the semiconductor chips in the second group transferred on the third support into a forth pitch different from the third pitch; and forming the insulating layer around each of the semiconductor chips, the insulating layer covering each of the semiconductor chips in the second group arranged with the forth pitch.

6. The method according to claim 1, wherein stretching and deformation of the second support causes the second pitch being longer than the first pitch.

7. The method according to claim 6, wherein the second pitch is longer than an integer multiple of a length of the semiconductor chips and 1.2 times or less the integer multiple of the length of the semiconductor chips.

8. The method according to claim 1, wherein each of the semiconductor chips includes a semiconductor layer having a luminous layer.

9. A manufacturing method of a semiconductor device comprising:
   stretching a first support supporting a plurality of semiconductor chips arranged in an initial pitch, and expanding pitches of the plurality of semiconductor chips from the initial pitch to a first pitch;
   transferring a first group from the first support to a second support, the first group selected from the plurality of semiconductor chips by the first support, the plurality of semiconductor chips arranged in the first pitch, the first group arranged in a second pitch being longer than the first pitch on the first support;
   forming an insulating layer around each of the semiconductor chips, the insulating layer covering each of the semiconductor chips in the first group arranged in the second pitch; and
   dicing the insulating layer.

10. The method according to claim 9, wherein the second pitch is longer than an integer multiple of a length of the semiconductor chips and 1.2 times or less the integer multiple of the length of the semiconductor chips.

11. The method according to claim 9, wherein the first pitch is longer than an integer multiple of a length of the semiconductor chips and 1.1 times or less the integer multiple of the length of the semiconductor chips.

12. The method according to claim 9, wherein the dicing of the insulating layer includes dicing the insulating layer along a dicing line inclined with respect to a side of the semiconductor chip.

13. The method according to claim 9, further comprising:
   transferring a second group from the first support to a third support, the second group selected from the plurality of semiconductor chips by the first support, the plurality of semiconductor chips arranged in the first pitch, the second group arranged in a third pitch being longer than the first pitch on the first support; and
   forming the insulating layer around each of the semiconductor chips, the insulating layer covering each of the semiconductor chips in the first group arranged in the third pitch.

14. The method according to claim 9, wherein each of the semiconductor chips includes a semiconductor layer having a luminous layer.

* * * * *